(12) United States Patent
Lasch et al.

(10) Patent No.: US 12,261,628 B2
(45) Date of Patent: *Mar. 25, 2025

(54) ADVANCED DATABASE DECOMPRESSION

(71) Applicant: SAP SE, Walldorf (DE)

(72) Inventors: Robert Lasch, Walldorf (DE); Ismail Oukid, Dresden (DE); Norman May, Karlsruhe (DE)

(73) Assignee: SAP SE, Walldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,140

(22) Filed: Feb. 23, 2024

(65) Prior Publication Data

US 2024/0204805 A1 Jun. 20, 2024

Related U.S. Application Data

(63) Continuation of application No. 18/046,782, filed on Oct. 14, 2022, now Pat. No. 11,962,330, which is a continuation of application No. 16/834,839, filed on Mar. 30, 2020, now Pat. No. 11,502,705.

(60) Provisional application No. 62/864,782, filed on Jun. 21, 2019.

(51) Int. Cl.
*H03M 13/37* (2006.01)
*G06F 3/06* (2006.01)
*G06F 16/901* (2019.01)
*H03M 7/30* (2006.01)

(52) U.S. Cl.
CPC ...... *H03M 13/3761* (2013.01); *G06F 3/0604* (2013.01); *G06F 3/064* (2013.01); *G06F 16/9027* (2019.01); *H03M 7/3095* (2013.01); *H03M 7/3097* (2013.01); *G06F 3/0679* (2013.01)

(58) Field of Classification Search
CPC .......... H03M 13/3761; H03M 7/3095; H03M 7/3097; H03M 7/3088; H03M 7/3091; G06F 16/9027; G06F 3/0604; G06F 16/1744
See application file for complete search history.

(56) References Cited

U.S. PATENT DOCUMENTS 11,962,330 B2 * 4/2024 Lasch ................. G06F 16/9027
2015/0178305 A1 6/2015 Mueller et al.

FOREIGN PATENT DOCUMENTS

EP 2889787 A2 7/2015

OTHER PUBLICATIONS

Google sparsehash. <https://github.com/sparsehash/sparsehash>, 2010.
(Continued)

*Primary Examiner* — Joseph J Lauture
(74) *Attorney, Agent, or Firm* — Mintz Levin Cohn Ferris Glovsky and Popeo, P.C.

(57) ABSTRACT

A method, a system, and a computer program product for decompressing data. One or more compressed blocks in a set of stored compressed blocks responsive to a request to access data in the set of stored compressed blocks are identified. String prefixes inside the identified compressed blocks are decompressed using front coding. String suffixes inside the identified compressed blocks are decompressed using a re-pair decompression. Uncompressed data is generated.

18 Claims, 19 Drawing Sheets

(56) References Cited

OTHER PUBLICATIONS

Intel® Xeon® Platinum 8180 Processor. https://ark.intel.com/content/www/us/en/ark/products/120496/intel-xeon-platinum-8180-processor-38-5m-cache-2-50-ghz.html.

Intel® Xeon® Scalable Processor—Instruction Throughput and Latency. https://software.intel.com/sites/default/files/managed/ad/dc/<https://software.intel.com/sites/default/files/managed/ad/dc/Intel-Xeon-Scalable-Processor-throughput-latency.pdf> Intel-Xeon-Scalable-Processor-throughput-latency.pdf <https://software.intel.com/sites/default/files/managed/ad/dc/Intel-Xeon-Scalable-Processor-throughput-latency.pdf>, 2017.

GeoNames dump. <http://download.geonames.org/export/dump/>, 2018.

Intel® 64 and IA-32 Architectures Optimization Reference Manual. <https://software.intel.com/sites/default/files/managed/9e/bc/64-ia-32-architectures-optimization-manual.pdf>//software.intel.com/sites/default/files/managed/9e/bc/_64-ia-32-architectures-optimization-manual.pdf <https://software.intel.com/sites/default/files/managed/9e/bc/64-ia-32-architectures-optimization-manual.pdf>, 2018. Accessed: Feb. 11, 2019.

Intel® Architecture Instruction Set Extensions and Future Features Programming Reference. https://software.intel.com/sites/default/files/managed/c5/15/architecture-instruction-set-extensions-programming-reference.pdf, 2018. Accessed: Mar. 7, 2019.

Intel® Intrinsics Guide. https://software.intel.com/sites/landingpage/IntrinsicsGuide/, 2018.

Laboratory for Web Algorithmics—Datasets. http://law.di.unimi.it/datasets.php, 2018.

Wikimedia database dumps. https://dumps.wikimedia.org/, 2018.

Intel® VTuneTM Amplifier. https://software.intel.com/en-us/vtune, 2019.

Daniel Abadi, Samuel Madden, and Miguel Ferreira. Integrating compression and exe¬cution in column-oriented database systems. In Proceedings of the 2006 ACM SIGMOD international conference on Management of data, pp. 671-682. ACM, 2006.

Gene M Amdahl. Validity of the single processor approach to achieving large scale com¬puting capabilities. In Proceedings of the Apr. 18-20, 1967, spring joint computer con-ference, pp. 483-485. ACM, 1967.

J. Arz and J. Fischer. Lz-compressed string dictionaries. In 2014 Data Compression Conference, pp. 322-331, Mar. 2014.

Philip Bille, Inge Li Gørtz, and Nicola Prezza. Practical and effective re-pair compression. 2017.

Paolo Boldi, Bruno Codenotti, Massimo Santini, and Sebastiano Vigna. Ubicrawler: A scalable fully distributed web crawler. Software: Practice & Experience, 34(8):711-726, 2004.

Nieves R Brisaboa, Rodrigo Canovas, Francisco Claude, Miguel A Mart?nez-Prieto, and Gonzalo Navarro. Compressed string dictionaries. In International Symposium on Exper-imental Algorithms, pp. 136-147. Springer, 2011.

Carlos Carvalho. The gap between processor and memory speeds. In Proc. of IEEE International Conference on Control and Automation, 2002.

David Clark. Compact pat trees. PhD thesis, University of Waterloo, 1998.

Graham Cormode and Marios Hadjieleftheriou. Finding frequent items in data streams. Proceedings of the VLDB Endowment, 1(2):1530-1541, 2008.

TPC Transaction Processing Performance Council. TPC benchmark D (decision support). http://www.tpc.org, May 1995. Standard Specification 1.0, Transaction Process-ing Performance Council (TPC).

Peter Deutsch. Deflate compressed data format specification version 1.3. Technical report, 1996.

Jarek Duda. Asymmetric numeral systems: entropy coding combining speed of huffman coding with compression rate of arithmetic coding. arXiv preprint arXiv:1311.2540, 2013.

Franz Farber, Norman May, Wolfgang Lehner, Philipp Große, Ingo Muller, Hannes Rauhe, and Jonathan Dees. The SAP HANA Database—An Architecture Overview. IEEE Data Eng. Bull., 35(1):28-33, 2012.

Fabian Giesen. Interleaved entropy coders. arXiv preprint arXiv:1402.3392, 2014.

Rodrigo Gonzalez and Gonzalo Navarro. Compressed text indexes with fast locate. In Annual Symposium on Combinatorial Pattern Matching, pp. 216-227. Springer, 2007.

Roberto Grossi and Giuseppe Ottaviano. Fast compressed tries through path decomposi-tions. Journal of Experimental Algorithmics (JEA), 19:3-4, 2015.

M. A. Harrison. Introduction to Formal Language Theory. Addison-Wesley Longman Publishing Co., Inc., Boston, MA, USA, 1st edition, 1978.

John L Hennessy and David A Patterson. Computer architecture: a quantitative approach. Elsevier, 2011.

Shunsuke Kanda, Kazuhiro Morita, and Masao Fuketa. Practical string dictionary com-pression using string dictionary encoding. In 2017 International Conference on Big Data Innovations and Applications (Innovate-Data), pp. 1-8. IEEE, 2017.

N Jesper Larsson and Alistair Moffat. Off-line dictionary-based compression. Proceedings of the IEEE, 88(11):1722-1732, 2000.

Daniel Lemire, Leonid Boytsov, and Nathan Kurz. SIMD compression and the intersection of sorted integers. CoRR, abs/1401.6399, 2014.

Christian Lemke, Kai-Uwe Sattler, Franz Faerber, and Alexander Zeier. Speeding up queries in column stores. In International Conference on Data Warehousing and Knowl-edge Discovery, pp. 117-129. Springer, 2010.

Igor L Markov. Limits on fundamental limits to computation. Nature, 512(7513):147, 2014.

Miguel A Martinez-Prieto, Nieves Brisaboa, Rodrigo Canovas, Francisco Claude, and Gonzalo Navarro. Practical compressed string dictionaries. Information Systems, 56:73-108, 2016.

Ahmed Metwally, Divyakant Agrawal, and Amr El Abbadi. Efficient computation of frequent and top-k elements in data streams. In International Conference on Database Theory, pp. 398-412. Springer, 2005.

Ingo Muller, Cornelius Ratsch, Franz Faerber, et al. Adaptive string dictionary compres¬sion in in-memory column store database systems. In EDBT, pp. 283-294, 2014.

Jeff Plaisance, Nathan Kurz, and Daniel Lemire. Vectorized VByte Decoding. iSWAG '15, pp. 1-6, 2015.

Jan M Rabaey, Anantha Chandrakasan, and Borivoje Nikolic. Digital integrated circuits. 2002.

Kensuke Sakai, Tatsuya Ohno, Keisuke Goto, Yoshimasa Takabatake, Tomohiro I, and Hiroshi Sakamoto. Repair in compressed space and time. Preprint, 2018.

Till Westmann, Donald Kossmann, Sven Helmer, and Guido Moerkotte. The implementation and performance of compressed databases. ACM Sigmod Record, 29(3):55-67, 2000.

Lan H Witten, Ian H Witten, Alistair Moffat, Timothy C Bell, Timothy C Bell, and Tim¬othy C Bell. Managing gigabytes: compressing and indexing documents and images. Morgan Kaufmann, 1999.

Ahmad Yasin. A top-down method for performance analysis and counters architecture. In 2014 IEEE International Symposium on Performance Analysis of Systems and Software (ISPASS), pp. 35-44. IEEE, 2014.

Jacob Ziv and Abraham Lempel. Compression of individual sequences via variable-rate coding. IEEE transactions on Information Theory, 24(5):530-536, 1978.

Marcin Zukowski, Sandor Heman, Niels Nes, and Peter Boncz. Super-scalar ram-cpu cache compression. In Proceedings of the 22nd International Conference on Data Engi-neering, p. 59. IEEE Computer Society, 2006.

Thomas Willhalm, Ismail Oukid, Ingo Muller, and Franz Farber 2013. Vectorizing Database Column Scans with Complex Predicates. In International Workshop on Accelerating Data Management Systems using Modern Processor and Storage Architectures—ADMS Jan. 12, 2013.

(56) References Cited

OTHER PUBLICATIONS

Thomas Willhalm, Nicole Popovici, Yazan Boshmaf, Hasso Plattner, Alexander Zeier, and Jan Schaffner, 2009. SIMD-scan: Ultra Fast In-memory Table Scan Using On-chip Vector Processing Units. Proc. VLDB Endow. 2. 1 (Aug. 2009), 385-394. https://doi.org/10/14778/1687671.
Aho, A.V., Corasick, M.J.: Efficient string matching: an aid to bibliographic search. Communications of the ACM 18(6), 333-340 (1975).
Gagie, T., I, T., Manzini, G., Navarro, G., Sakamoto, H., Takabatake, Y.: Rpair: Rescaling repair with rsync. In: N.R. Brisaboa, S.J. Puglisi (eds.) String Processing and Informaiton Retrieval. pp. 35-44. Springer International Publishing (2019).
Lasch, R et al., "Fast & Strong: The Case of Compressed String Dictionaries on Modern CPUs," DaMoN '19, Proceedings of the 15th International Workshop on Data Management on New Hardware Jul. 2019 (10 pages).
Sekine, K. et al., Variable-to-Fixed-Length Encoding for Large Texts Using Re-Pair Algorithm with Efficient Shared Dictionaries, DEIM Forum Japan, 2013 (8 pages).
Office Action received in corresponding Japanese Patent Application No. 2020-106075 dated Jul. 25, 2022, 8 pages.
Raskulinec, G.M. et al., "High Performance Parallelism Pearls," vol. 2: Multicore and Many-core Programming Approaches, Jul. 31, 2015, pp. 421-440.
Office Action received in corresponding Canadian Patent Application No. 3,084,406 dated Sep. 11, 2023, 8 pages.

\* cited by examiner

|  | Strings | Size [B] | Aver. Size [B] |
|---|---|---|---|
| UK | 18,520,486 | 1,438,713,778 | 76.68 |
| INDOCHINA | 7,414,866 | 642,708,139 | 85.68 |
| ENWIKI | 35,280,643 | 708,340,085 | 19.08 |
| GEONAMES | 7,307,721 | 114,590,206 | 14.68 |

| | UK | | INDOCHINA | | ENWIKI | | GEONAMES | |
|---|---|---|---|---|---|---|---|---|
| RPFC | 14.2% | 1544.9 s | 12.0% | 358.1 s | 30.8% | 984.7 s | 32.1% | 53.1 s |
| RPFC8 | 18.3% | 1140.4 s | 18.0% | 509.2 s | 33.8% | 870.8 s | 35.4% | 52.4 s |
| RPFC8 16bps | 17.4% | 813.9 s | 16.8% | 216.4 s | 31.4% | 604.5 s | 32.3% | 41.9 s |
| B=128 | 18.9% | 43.1 s | 17.7% | 18.7 s | 47.9% | 49.5 s | 52.9% | 8.7 s |
| B=256 | 18.3% | 44.7 s | 17.3% | 18.9 s | 44.4% | 51.7 s | 49.1% | 9.3 s |
| B=512 | 17.8% | 46.9 s | 17.0% | 19.5 s | 41.4% | 55.9 s | 45.9% | 9.9 s |
| B=1K | 17.3% | 49.7 s | 16.7% | 19.9 s | 38.9% | 61.8 s | 43.2% | 10.6 s |
| B=2K | 16.9% | 54.1 s | 16.5% | 21.5 s | 36.7% | 72.1 s | 40.8% | 12.1 s |
| B=4K | 16.5% | 62.9 s | 16.2% | 23.1 s | 34.8% | 86.4 s | 38.8% | 15.0 s |
| B=8K | 16.2% | 138.1 s | 16.1% | 29.0 s | 33.1% | 213.1 s | 36.9% | 27.4 s |
| B=16K | 15.9% | 156.0 s | 15.9% | 46.6 s | 31.6% | 198.9 s | 35.3% | 35.7 s |
| B=32K | 15.7% | 172.5 s | 15.7% | 64.5 s | 30.4% | 221.1 s | 33.8% | 79.2 s |
| B=64K | 15.8% | 211.4 s | 15.8% | 74.6 s | 29.8% | 254.3 s | 32.8% | 68.8 s |
| B=128K | 15.9% | 252.1 s | 16.0% | 81.5 s | 29.6% | 589.4 s | 32.6% | 68.3 s |
| PFC | 27.5% | 3.5 s | 29.9% | 1.5 s | 50.4% | 3.3 s | 56.1% | 0.5 s |

BRPFC8 16bps varying B

FIG. 7a

RPFC extract implementation — 700

```
1: function EXTRACT(id, outputBuffer)
2:     if id is valid then
3:         bucketId ← ⌊(id-1)/bucketsize⌋
4:         position ← (id − 1) mod bucketsize
5:         length ← 0
6:         bucket ← GETBUCKETHEADER(bucketId, outputBuffer)
7:         if position > 0 then
8:             offset ← 0
9:             for i ← 1; i ≤ position; i ← i + 1 do
10:                DECODESTRING(outputBuffer, length, bucket, offset)
11:            end for
12:        end if
13:        return length
14:    else
15:        return −1
16:    end if
17: end function
```

FIG. 7b

```
                    RPFC locate implementation                           ⟵ 710
1:  function LOCATE(string)
2:      header ← false
3:      bucketId ← LOCATEBUCKET(string, header)
4:      id ← 0
5:      if header then
6:          id ← bucketId · bucketsize + 1
7:      else
8:          if bucketId valid then
9:              length ← 0
10:             bucket ← GETBUCKETHEADER(bucketId, outputBuffer, length)
11:             offset ← 0
12:             for i ← 1; i < number of strings in the bucket; i ← i + 1 do
13:                 DECODESTRING(outputBuffer, length, bucket, offset)
14:                 if strings in outputBuffer and string are equal then
15:                     return bucketId · bucketsize + i + 1
16:                 end if
17:             end for
18:         end if
19:     end if
20:     return id
21: end function
```

| | Recursive Re-Pair symbol expansion |
|---|---|
| 1: | function EXPANDNONTERMINAL(nonterminal, grammar, outputBuffer) |
| 2: | left ← GETFIELD(grammar, [log$_2$(n + N)] · 2 · nonterminal) |
| 3: | right ← GETFIELD(grammar, [log$_2$(n + N)] · 2 · nonterminal + 1) |
| 4: | if left < n then |
| 5: | outputBuffer[expanded] ← left |
| 6: | expanded ← 1 |
| 7: | else |
| 8: | expanded ← EXPANDNONTERMINAL(left −n, grammar, outputBuffer) |
| 9: | end if |
| 10: | if right < n then |
| 11: | outputBuffer[expanded] ← right |
| 12: | expanded ← expanded + 1 |
| 13: | else |
| 14: | expanded ← expanded + EXPANDNONTERMINAL(right − n, grammar, outputBuffer at offset expanded) |
| 15: | end if |
| 16: | return expanded |
| 17: | end function |

FIG. 10

Simplified iterative Re-Pair symbol expansion  —1000

```
1: function EXPANDSYMBOL(symbol, grammar, outputBuffer)
2:     current ← symbol
3:     stack ← buffer of size 32
4:     pos ← 0, stackPos ← -1
5:     do
6:         if current ≥ n then                                              ▷ expand non-terminal
7:             left ← GETFIELD(grammar, ⌈log₂(n + N)⌉, 2 · (current − n))
8:             right ← GETFIELD(grammar, ⌈log₂(n + N)⌉, 2 · (current − n) + 1)
9:             current ← left
10:            stack[stackPos++] ← right
11:        else                                                             ▷ expand terminal
12:            outputBuffer[pos++] ← current
13:            current ← stack[--stackPos]
14:        end if
15:    while stackPos > 0
16:    return pos
17: end function
```

FIG. 11b

```
1  uint32_t RePair::expand16Symbols(uint32_t* symbols, uchar* str) {
2      initialization  1102
3
4      for (size_t iter = 0; iter < 15; iter++) {
5          branch 1   1104a
6          branch 2   1104b
7                     predicate evaluation   1106
8
9      }
10     result output   1108
11
12 }
```

ADVANCED DATABASE DECOMPRESSION

CROSS-REFERENCE TO RELATED APPLICATIONS

This application is a continuation of U.S. patent application Ser. No. 18/046,782 filed on Oct. 14, 2022, entitled "ADVANCED DATABASE DECOMPRESSION," which is a continuation application of U.S. patent application Ser. No. 16/834,839 filed on filed on Mar. 30, 2020, now U.S. Pat. No. 11,502,705, entitled "ADVANCED DATABASE DECOMPRESSION," which claims priority to U.S. Provisional Application No. 62/864,782 filed on Jun. 21, 2019, entitled "ADVANCED DATABASE COMPRESSION ON MODERN HARDWARE," the entire contents of this application are incorporated herein by reference in their entirety.

TECHNICAL FIELD

This disclosure relates generally to data processing and, in particular, to database compression and decompression.

BACKGROUND

In databases, domain encoding is a technique widely used in column-stores for compression and query acceleration. It replaces the values in a column with unique integer value identifiers. The mapping from identifiers back to the actual values is stored in an additional data structure, the dictionary. This means that the representation of a column using domain encoding requires two data structures: a dictionary and an array of value identifiers. The dictionary stores the distinct values in the column and provides a mapping from unique identifiers to the values. The array of value identifiers acts as indices into the dictionary. This is also called the index vector.

Values occurring multiple times in the column are only stored once in the dictionary. This means that columns containing only few distinct values that occur several times in the column are compressed significantly by this approach. This is because the value identifiers used to replace values are often significantly smaller than the actual values. By replacing values with value identifiers, domain encoding can also improve performance, because some operations that would be performed on the values themselves without domain encoding can also be performed on the value identifiers directly.

For columns storing strings, the dictionary used for domain encoding is a string dictionary. A string dictionary is a data structure realizing a bijective mapping of strings from a set of strings X to unique integer identifiers. In the case of string dictionaries, one of the simplest ways to achieve compression is to lexicographically sort the strings in the dictionary and to then apply front coding, which compares each string to its predecessor (i.e., the first string (of a block) is stored completely. Subsequent strings store the length of the prefix shared with the predecessor and the uncompressed suffix). Front coding is typically applied to fixed-size buckets of strings.

SUMMARY

In some implementations, the current subject matter relates to a computer implemented method for executing decompression of data. The method may include identifying one or more compressed blocks in a set of stored compressed blocks responsive to a request to access data in the set of stored compressed blocks, decompressing string prefixes inside the identified compressed blocks using front coding, decompressing string suffixes inside the identified compressed blocks using a re-pair decompression, and generating uncompressed data.

In some implementations, the current subject matter may include one or more of the following optional features. In some implementations, the re-pair decompression may include iteratively expanding each symbol in a symbol tree corresponding to the data stored in the identified compressed blocks. The symbol tree may include a plurality of nodes. The compressed blocks may be generated from one or more front coded buckets of strings in a dictionary. The front-coded buckets may be configured to be sampled to form one or more superblocks. Each of the superblocks may be configured to be compressed to generate a shared grammar for compression of the compressed blocks. The plurality of nodes may include at least one of the following: a terminal character, a non-terminal character, and any combination thereof. In some implementations, the method may further include performing a plurality of re-pair decompressions in parallel. The number of terminal characters may be limited to a predetermined number. Further, the number of iterative expansions of each symbols may be determined based on the predetermined number.

In some implementations, the re-pair decompression may include: initializing a stack position in a memory corresponding to each symbol in the symbol tree, simultaneously loading, using a vectorized re-pair expansion, each symbol in the symbol tree from storage into the memory, combining loaded symbols into the uncompressed data by evaluating one or more predicates associated with the symbols, and repeating, using the predetermined number, the simultaneous loading and the combining.

In some implementations, each block in the set of compressed blocks may include a sequence of bucket headers and compressed buckets. The block size may be at least one of the following: a fixed size and a variable size. Further, the compressed blocks may be compressed using re-pair compression.

In some implementations, the current subject matter relates to a computer implemented method for executing database compression. The method may include generating, from a dataset, a compressed string dictionary having a block size and a front coding bucket size, applying front coding to one or more buckets of strings in the dictionary having the front coding bucket size to generate one or more front coded buckets of strings, concatenating one or more portions of the generated front coded buckets of strings to form one or more blocks having the block size, compressing each of the one or more blocks, and storing a set of one or more compressed blocks, wherein the set of the compressed blocks storing all strings in the dataset.

In some implementations, the current subject matter may include one or more of the following optional features. In some implementations, each block in the set of compressed blocks may include a sequence of bucket headers and compressed buckets.

In some implementations, the method may also include inserting a termination character between buckets of strings in the plurality of front coded buckets of strings. The termination character might not be compressed.

In some implementations, each string may include a string termination character, wherein each string termination character is compressed.

In some alternate implementations, the length of each string can be stored and compressed with the string.

In some implementations, the block size may be at least one of the following: a fixed size and a variable size.

In some implementations, the compression may include independently executing compression of each front coded bucket in the plurality of buckets in parallel.

In some implementations, one or more front-coded buckets may be configured to be sampled from one or more superblocks. Each superblock may be configured to be subsequently compressed to generate a shared grammar for compression of the blocks. For example, the shared grammar may be used to perform accelerated compression of the blocks.

In some implementations, the compression of blocks may include Re-Pair compression.

In some implementations, the method may further include receiving a request to access data in the set of stored compressed blocks, identifying one or more compressed blocks in the set of stored compressed blocks responsive to the received request, and at least partially decompressing the identified compressed blocks to generate uncompressed data. The decompression may include decompressing string prefixes and suffixes inside the identified compressed blocks using front coding, and decompressing string suffixes inside the identified compressed blocks using a re-pair decompression. Further, the re-pair decompression may include iteratively expanding each symbol in a symbol tree corresponding to the data stored in the identified compressed blocks.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 3 illustrates exemplary experimental datasets, according to some implementations of the current subject matter;

FIG. 4 illustrates exemplary experimental measured compression times, according to some implementations of the current subject matter;

FIG. 7a illustrates an exemplary extract function;

FIG. 7b illustrates an exemplary implementation of the locate function;

FIG. 8 illustrates an exemplary process for recursively expanding non-terminals, which is the operation that is performed for every symbol to decompress a text compressed with re-pair;

FIG. 10 illustrates an exemplary ExpandSymbol function;

FIG. 11b illustrates an exemplary code that may be used to execute the algorithm shown in FIG. 11a, according to some implementations of the current subject matter;

DETAILED DESCRIPTION

Figure 1:
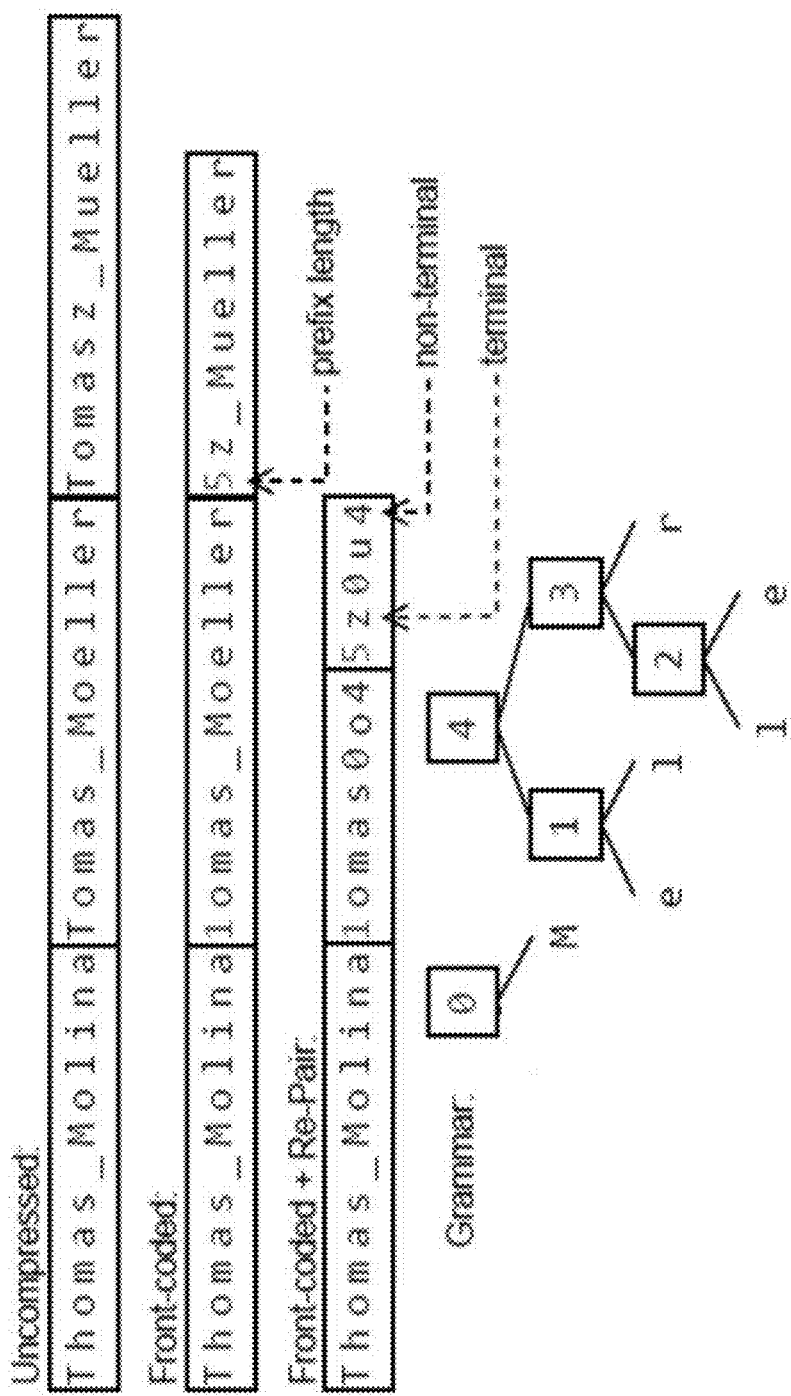
FIG. 1 illustrates an exemplary plain front coding compression method.

To address these and potentially other deficiencies of currently available solutions (e.g., low compression rate for front coding, high compression time and extract time for other compression schemes, etc.), one or more implementations of the current subject matter relate to methods, systems, articles of manufacture, and the like that can, among other possible advantages, provide an ability to perform database compression as well as decompression and access to compressed data.

Data Compression

In some implementations, the current subject matter relates to database compression. Database compression may be accomplished by generating, in a dataset, a compressed string dictionary having a block size and a front coding bucket size. A front coding may be applied to each string in the dictionary having a combination of the block size and the front coding bucket size to generate a plurality of front coded buckets of strings. The plurality of front coded buckets of strings may be concatenated. A termination character may be inserted between buckets of strings in the plurality of front coded buckets of strings. The plurality of front coded buckets of strings may be compressed. Based on the compressed front coded buckets, a set of compressed blocks corresponding to each string in the dictionary may be generated and stored. In some implementations, each block in the set of compressed blocks may include a sequence of bucket headers and compressed buckets. The termination character might not be compressed. In some implementations, each string may include a string termination character, wherein each string termination character is compressed.

In-memory database management systems (IMDBMS) have been adopted for use in many areas and are still gaining more widespread use. IMDBMS typically rely on data compression to facilitate keeping their entire working set in main memory. Nevertheless, such systems commonly have multi-terabyte memory footprints. Especially, but not exclusively, in cloud scenarios, the cost of main memory is one of the largest factors in the total cost of ownership (TCO). Therefore reducing the memory footprint of IMDBMS is highly desirable as a means to reduce TCO.

Surveying real-world IMDBMS systems shows that string dictionaries are the single largest memory consumer. Their compression thereby significantly affects the systems' total memory footprint. A multitude of techniques to heavily compress string dictionaries exist, but in practice, IMDBMS still rely on lightweight methods as they offer much faster compression and, more importantly, access operations several times faster than heavyweight methods. While the related work focusses on closing this gap through algorithmic improvements and novel methods, making use of advancements in modern hardware to improve existing methods remains largely unexplored.

In some implementations, the current subject matter relates to a computer-implemented method for performing database compression by optimizing string dictionary compression processes. The current subject matter method may include a block-based re-pair compression algorithm that may reach practical compression times up to 24 times faster than some of the existing processes without majorly sacrificing compression rates.

Dictionary compression is a popular method in databases to reduce their memory requirements. The dictionary maps values of the domain of a (set of) column(s) to value identifiers (IDs). In the records, these values are replaced by the corresponding values IDs which may lead to space savings—especially for strings—and enables efficient processing on dictionary-encoded values. The string dictionary then offers two access operations: 1) given a value ID id, extract(id) returns the corresponding string in the dictionary, and 2) given a string str, locate(str) returns the unique value ID of str if str is in the dictionary or the value ID of the smallest string greater than str otherwise.

There are several existing ways to perform compression of string dictionaries. These include front coding, Huffman-Tucker coding, N-Gram compression, and Re-Pair compression. Plain front coding (PFC) is a light-weight method to compress sorted string dictionaries. Strings are represented by the length of the common prefix with their predecessor in the dictionary and the remaining suffix, as shown by the second row in FIG. 1, which illustrates an exemplary PFC compression method 100. As shown in FIG. 1, each box is the representation of one string in the dictionary. With the front-coded representation, the last two strings are compressed. The first one is not, as it has no predecessor. PFC operates on fixed-size buckets. In some exemplary implementations, the bucket size may be 16 strings. The first string of each bucket (the bucket header) is stored uncompressed. This facilitates random accesses to the string dictionary. Without buckets, each access would require decoding all prior strings in the dictionary. With buckets, strings only have to be decoded starting from the beginning of the bucket the desired string is contained in.

Re-Pair compression method is a grammar-based compression method. It iteratively obtains a grammar from an input text T and transforms the text into a compressed sequence of symbols. In each iteration, it first finds the most frequent pair of symbols ab in T. If multiple pairs with the same frequency exist, one candidate is chosen at random. Then, it adds a rule R→ab to the grammar, where R is a non-terminal symbol that does not previously appear in T or in the grammar and a and b can be any symbols (terminal or non-terminal). Then, it replaces every occurrence of ab in T by R. This iteration terminates when there are no pairs of symbols left that occur more than once in T.

Re-Pair on top of PFC (Re-Pair Front Coding (RPFC)) method provides a further alternative to compression. Referring back to FIG. 1, the third row shows how Re-Pair is applied on top of PFC. RPFC applies Re-Pair on top of all front-coded buckets in the dictionary, but the bucket headers are left uncompressed. One grammar is created for the whole dictionary. As shown in FIG. 1, this grammar may be visualized as a set of binary trees, where the inner nodes are non-terminals, and the leaf nodes are terminals.

However, the existing compression methods, including the Re-Pair compression algorithm for RPFC compression has various shortcomings when performing compression of large string dictionaries. For RPFC specifically, the compression times it requires are very high in comparison to lightweight compression methods. Further, the compression times grow in a super-linear manner with increasing input data size, as can be observed when compressing datasets of different sizes. This makes the required compression time for RPFC quickly become impractical once the size of the uncompressed string dictionary exceeds a few hundred megabytes. Second, the algorithm's memory consumption amounts to multiple times the input text size.

To address these problems, in some implementations, the current subject matter provides a block re-pair front coding (BRPFC) method that may be executed by reducing a size of text T that is to be compressed using the Re-Pair method. In particular, to reduce the size of T, a dictionary may be split into blocks containing a fixed number of front-coded buckets before applying Re-Pair compression on each block individually.

A BRPFC compressed string dictionary with block size B and front coding bucket size b may be constructed as follows: for each B·b strings in the lexicographically sorted dictionary, front coding may be applied first. This results in B front coded buckets of strings. Then, the buckets may be concatenated, omitting the bucket headers. A termination character t may be inserted between each of the buckets. A different termination character u may be used to terminate the front-coded strings inside the buckets. The concatenated buckets may be now compressed using Re-Pair. The Re-Pair algorithm may ignore the termination character t, but may compress the termination character u that is used to terminate strings. Thus, bucket boundaries may be at integral numbers of symbols after Re-Pair compression, but string boundaries are not necessarily. After Re-Pair compression, the compressed sequence may be split into the sub-sequences that may correspond to each front-coded bucket. These may be reunited with their respective bucket headers and finally concatenated in a contiguous sequence. Offsets to the beginning of each bucket may be stored in a separate array, and the grammar produced by Re-Pair may also be stored as part of each block. This process results in a set of compressed blocks, each storing B·b strings, except for the last block, which may possibly contain fewer strings if the number of strings in the dictionary is not a multiple of B·b. Each block may include a sequence of bucket headers and compressed buckets, the offset array to bucket headers.

Figure 2A:
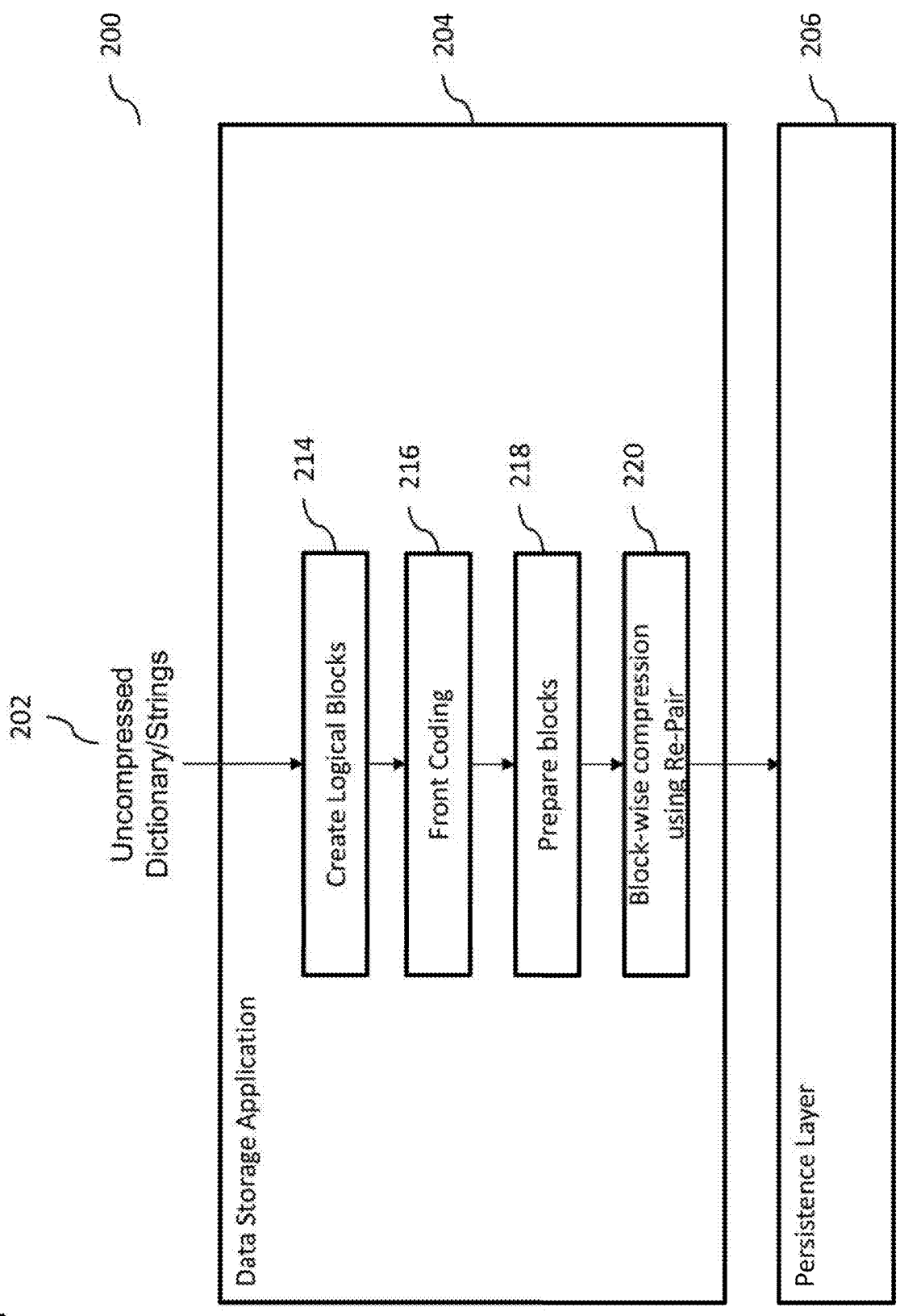
FIG. 2a illustrates an exemplary system for executing dictionary compression, according to some implementations of the current subject matter.
Figure 2B:
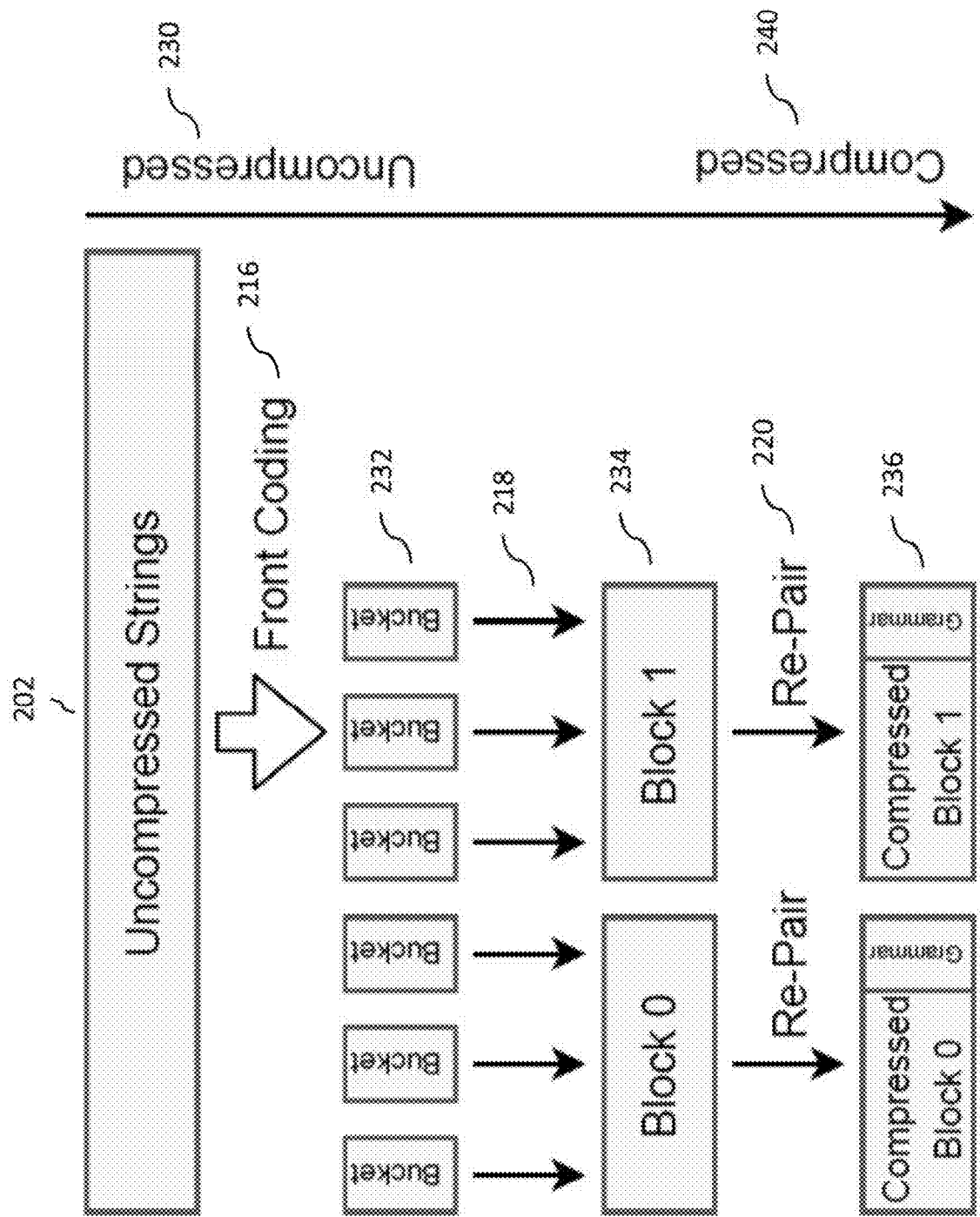
FIG. 2b illustrates further details of the exemplary system for executing dictionary compression shown in FIG. 2a, according to some implementations of the current subject matter.

FIGS. 2a-b illustrate an exemplary system 200 for executing dictionary compression, according to some implementations of the current subject matter. The system 200 may include a data storage application 204 communicatively coupled to a persistence layer 206. The data storage application 204 may be configured to include computing components 214-220 for executing dictionary compression, as discussed herein (as shown in FIG. 2a). In particular, upon the data storage application 204 receiving an uncompressed dictionary 202 data (state 230 shown in FIG. 2b), the computing component 214 may be configured to generate one or more logical blocks. Using the generated logical blocks, the computing component 216 may be configured to apply front coding to generate a fixed number of front-coded buckets 232 (as shown in FIG. 2b). The front-coded buckets may be used by the computing component 218 to prepare blocks for Re-Pair compression. In particular, as stated above, the front coded buckets may be concatenated, where the bucket headers may be omitted. A termination character t may be inserted between the buckets. A different termination character u may be used to terminate the front-coded strings inside the buckets. The concatenated prepared blocks may then be used by the component 220 to apply block-wise compression using Re-Pair algorithm to generate one or more compressed blocks 236 (as shown in FIG. 2b, at compressed state 240).

As stated above, the re-pair algorithm may ignore the termination character t and may compress the termination character u. After re-pair compression, the compressed sequence may be split into the sub-sequences corresponding to each front-coded bucket, which may be reunited with their respective bucket headers and finally concatenated in a contiguous sequence. Offsets to the beginning of each bucket may be stored in a separate array, and the grammar produced by re-pair may also be stored as part of each block. This process results in a set of compressed blocks 236, each storing B·b strings, except for the last block, which may possibly contain fewer strings if the number of strings in the dictionary is not a multiple of B·b. The compressed dictionary may then be transmitted to the persistence layer 206 for storage.

FIGS. 3-4 illustrate various experimental measurements of compression times of dictionary data sets. In particular, FIG. 3 illustrates exemplary experimental datasets 300. For example, as shown in FIG. 3, Strings may refer to the number of distinct strings in the dataset, Size may refer to the total size of all strings in bytes, including termination characters, and Aver. Size may refer to the average size of a single string in the dataset. These datasets may be selected to cover common use cases for string columns, such as natural language (ENWIKI), names (GEONAMES), and machine-readable data (INDOCHINA, UK). They also range from short average string size (GEONAMES, ENWIKI) to long average string size (INDOCHINA, UK).

FIG. 4 illustrates exemplary experimental measured compression times 400. Each column, as shown in FIG. 4, shows the compression ratios for one of the four evaluated datasets (shown in FIG. 3). Each row corresponds to a different compression method. For the BRPFC8 16 bps method, different block sizes B ranging from 128 to 128K front-coded buckets per block have been evaluated. In combination with the compression time results, a block size with the best tradeoff between compression time and compression ratio was determined.

As shown in FIG. 4, the method RPFC8 16 bps compression times are faster than those of RPFC. This is because the number of symbols is limited by their 16-bit representation in RPFC8 16 bps, thereby reducing the number of iterations done by the algorithm. Further, the method BRPFC8 16 bps compression is significantly faster than that of RPFC at smaller block sizes and also stays faster even at larger block sizes, except for the Geonames dataset where BRPFC becomes slower than RPFC at B=32K. BRPFC8 16 bps compression times increase slowly with increasing block sizes. However, compression times increase dramatically between B=4K and B=8K for UK, ENWIKI, and GEONAMES, and between B=8K and B=16K for INDOCHINA. This is because at these block sizes, the working dataset of the re-pair algorithm outgrows the CPU caches, thereby increasing the runtime significantly.

Figure 5:
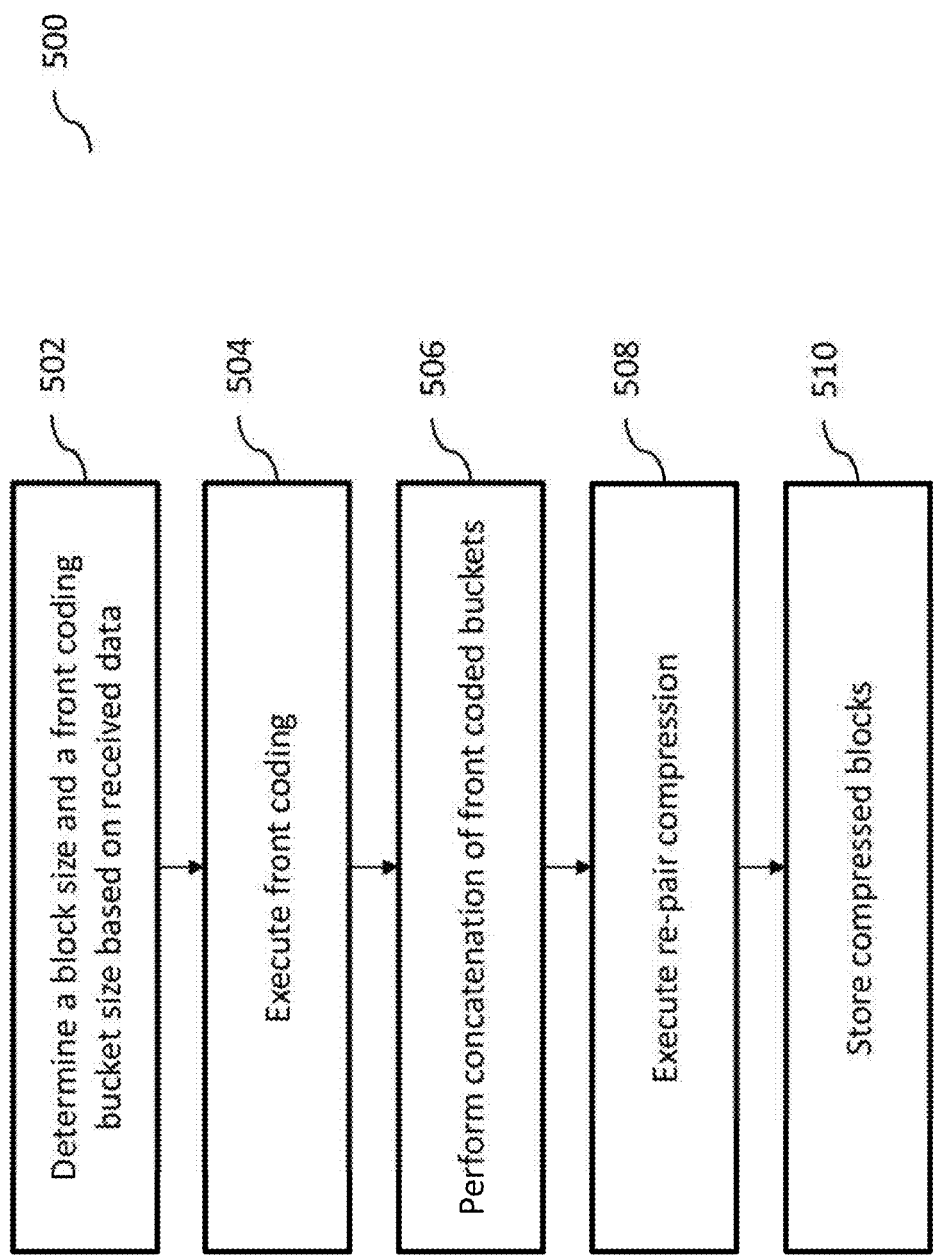
FIG. 5 illustrates an exemplary process for executing dictionary data compression, according to some implementations of the current subject matter.

FIG. 5 illustrates an exemplary process 500 for performing dictionary data compression, according to some implementations of the current subject matter. The process 500 may be performed by the dictionary data compression system 200 shown in FIG. 2. At 502, the data storage application 204 (as shown in FIG. 2) may be configured to generate a compressed string dictionary having a block size and a front coding bucket size. At 504, the application 204 may be configured to apply a front coding to each string in the dictionary, where the string has the front coding bucket size. As a result the application may be configured to generate a plurality of front coded buckets of strings. Subsequently, one or more portions of the front coded buckets of strings may be concatenated to form blocks having the predetermined block size, at 506. In some exemplary implementations, a termination character may be inserted between buckets of strings. The application 204 may then compress each block, at 508, thereby generating a set of compressed blocks corresponding to each string in the dictionary, at 510. The application 204 may then also store the compressed blocks in the persistence layer 206.

Figure 6:
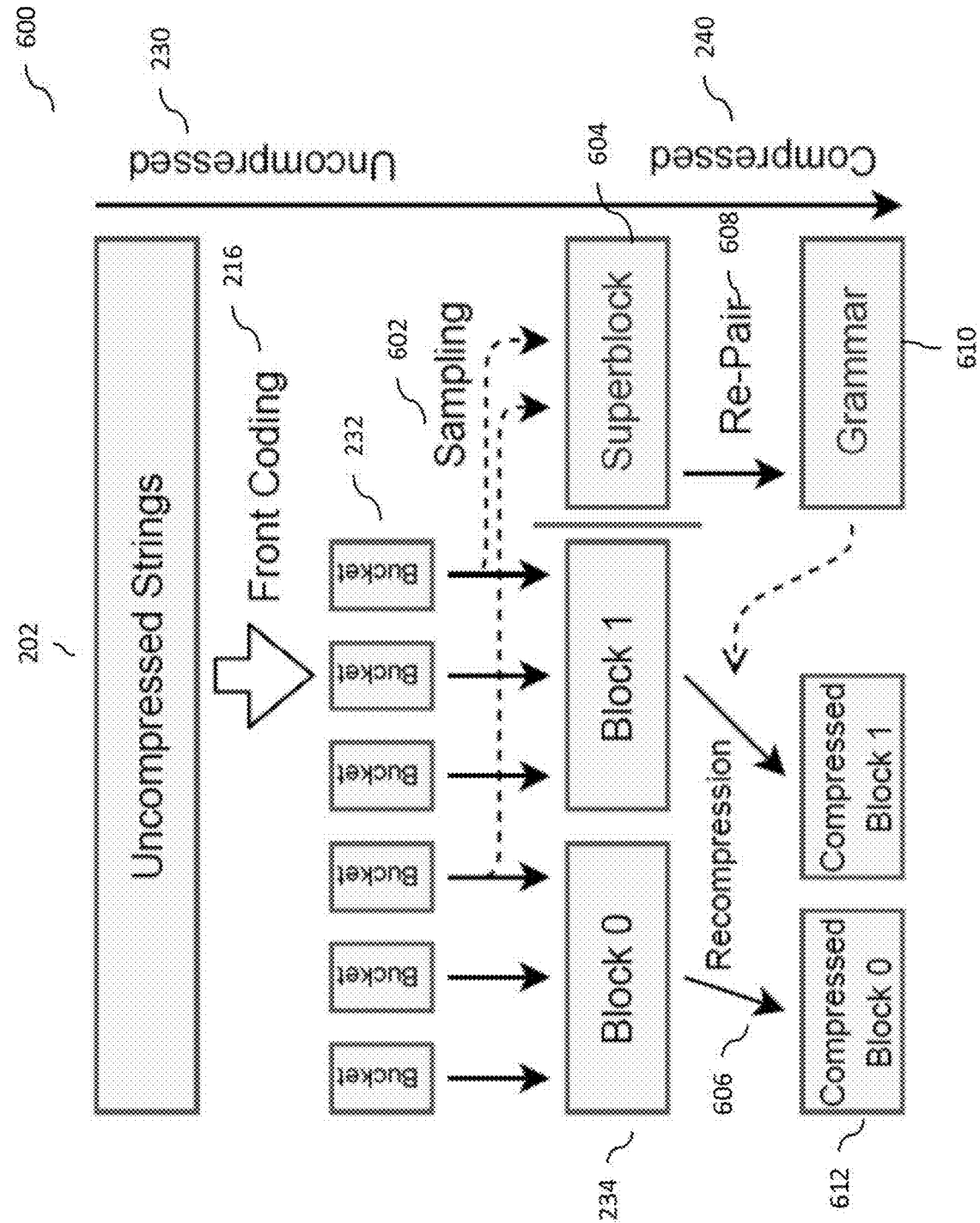
FIG. 6 illustrates an alternate implementation of dictionary/string compression process, according to some implementations of the current subject matter.

FIG. 6 illustrates an alternate implementation of dictionary/string compression process 600, according to some implementations of the current subject matter. The process 600 may be similar to the process shown in FIGS. 2a-b. The compression process 600 shown in FIG. 6 may be referred to as a sampled block-based re-pair compression. The process 600 may be configured to alter the process shown in FIGS. 2a-b by eliminating an overlap in grammar rules of blocks, which may improve the compression quality. Because it is not necessary to perform full re-pair compression on the entire dictionary, but only on some smaller part of it, compression may be accelerated.

As shown in FIG. 6, the process 600 may begin in a similar way as the process shown in FIGS. 2a-b (at the uncompressed state 230), by creation of front-coded buckets 232 through application of front coding 216 to logical blocks created from the uncompressed dictionary strings. The process 600 may then be configured to generate a single re-pair grammar 610 subsequent to the front-coding stage. That grammar may then be used to compress all blocks of the dictionary. The grammar may be generated by sampling, at 602, a selected number of front-coded buckets 232 to form a superblock 604. The superblock 604 may include one or more front-coded buckets to reach a predetermined target size. The target size may be determined to optimize the resulting grammar. Selection and/or sampling (e.g., sampling without replacement, van de Corput sequence that results in a uniform distribution of sampled strings, and/or any other sampling methods) of front-coded buckets 232 for the purposes of including them in the superblock 604 is terminated when the target size has been reached. The superblock may then be compressed using the re-pair algorithm 608 and the resulting grammar 610 may be used as a shared grammar (as shown by the dashed arrow).

Then, a recompression 606 may be applied to the blocks 234 of the dictionary. Its inputs may be shared grammar and an uncompressed block. Recompression 606 may generate one or more compressed blocks 612. For recompression, a tree containing all expanded rules from the shared grammar may be generated, where the tree nodes that correspond to an expanded rule may be tagged with the rule's non-terminal symbol. Each block may then be compressed using that representation of the shared grammar. At each position in a block's text, the tree may be traversed using symbols from the text. As a result, several rule expansions may be found to match the string at the current position in the text. The longest one may be selected and that segment in the text may be replaced with the rule's non-terminal. This process may be repeated at the next position after the replaced segment in the text and continues until the whole text has been compressed. If no match in the expanded rules is found, the recompression algorithm may continue to the next position in the text.

Decompression and Access to Compressed Data

In some implementations, the current subject matter may be configured execute decompression and/or access to compressed data. In particular, the current subject matter may be configured to accelerate compressed data access times, specifically the extract and locate functions times, for RPFC, BRPFC, and sampled BRPFC compressed string dictionaries. To improve the access times, different parts of the extract and locate operations may be implemented.

FIG. 7a illustrates an exemplary extract function 700 that may be configured to extract a string with the value identifier id into a pre-allocated output buffer outputBuffer and return the length of the extracted string, if the requested string is present in the dictionary. Otherwise −1 is returned to signal that the requested value identifier is invalid. Valid identifiers are in the range [1;E], where E is the number of strings in the dictionary. If the requested identifier is valid, the bucket that the requested string resides in and the position of the string within that bucket is determined first.

Once the bucket that the requested string resides in has been determined, the header of that bucket is copied to the output buffer using the GetBucketHeader function. This function copies the zero-terminated bucket header of the bucket referenced to by bucketId to the output buffer outputBuffer and reports the length of the copied string through its third parameter, length. Lastly, the function returns a pointer to the compressed bucket, which immediately follows the bucket header in the compressed dictionary. If the requested string in extract is the bucket header, i.e., position equals 0, then the length of the bucket header can be returned directly as the output buffer already contains the requested string.

Otherwise, the remainder of the bucket is decompressed partially until the position of the requested string is reached. This decompression involves re-pair decompression, as well as decoding the front-coded strings after the re-pair decompression. This process happens in an interleaved fashion. One or two re-pair symbols are expanded at a time and the algorithm then proceeds to decode as much of the front-coded string as it can with the output of the expanded re-pair symbol. The strings are decoded directly to the pre-allocated output buffer. Once the position of the requested string in the bucket is reached and that string is decoded, the length of the decoded string can be returned. This way, only the part of the bucket that is necessary to extract the requested string is decompressed and decoded and the remainder of the bucket is left untouched, avoiding unnecessary decompression of the whole bucket. Of course, if the requested string is the last string in the bucket, the whole bucket has to be decompressed to extract that string.

As shown in FIG. 7a, the buffer containing the compressed bucket without the header is pointed to by the variable bucket and the decompression of a single string is implemented in the function DecodeString, which is repeatedly called by the extract function in line 10 until the requested string has been decoded. The DecodeString function is called with the output buffer, which already contains the previously decoded string and the bucket buffer, which contains the compressed bucket after the header. The length parameter is assigned to the length of the decoded string by the DecodeString function and the offset parameter is used to keep track of how many bits of the compressed bucket have already been decoded.

FIG. 7b illustrates an exemplary implementation of the locate function 710. This function takes the string string as its input and either returns 0 if string is not contained in the dictionary, or a valid value identifier if it is. The function is executed by first performing a binary search on the headers of the buckets in the compressed dictionary. This binary search is implemented in the LocateBucket function. If the binary search determines a potential bucket that the searched string could be in, this bucket is scanned. If the scan finds the sought-after string in the bucket, its value identifier can be returned, otherwise the operation's result is that the string is not in the dictionary. This is also the case if the binary search does not find a potential bucket. In these cases, the invalid value identifier 0 is returned to signal the absence of the searched string from the dictionary.

The LocateBucket function also sets the header Boolean flag to true, if the searched string was identified as the header of the bucket returned by the binary search. In this case, no additional scanning of the bucket has to be done. Scanning the bucket identified by the binary search is implemented similarly to the extract operation discussed above. The strings in the bucket are sequentially decompressed into the buffer outputBuffer using the DecodeString function. The decompressed strings are then compared to the searched string until either a match is found or the end of the block has been reached.

FIG. 8 illustrates an exemplary process 800 for recursively expanding non-terminals, which is the operation that is performed for every symbol to decompress a text compressed with re-pair. The process 800 includes an ExpandNonTerminal function used in the RPFC extract and locate implementations for the purpose of decompressing the re-pair compression that is applied on top of front coding. Its arguments are the non-terminal nonTerminal that is to be expanded, the bit-packed grammar array grammar and a pre-allocated output buffer outputBuffer, where the expanded characters are stored. The function returns the number of characters that it expanded.

To expand a non-terminal, the two symbols that it maps to are first extracted from the grammar array using the GetField function. After this step, the left symbol that the non-terminal maps to has to be recursively expanded first, followed by the same operation for the right symbol. For both the left and the right symbol, it is however, first checked if the symbols are already terminals, in which case no additional expansion has to be performed and the symbol can be written to the output buffer. This is the end case of the recursion. A symbol is a terminal if the symbol is smaller than the number of terminals n. This is because terminals are encoded as integer symbols in the range [0; n) and non-terminals are encoded as integer symbols in the range [n; n+N], where N is the number of non-terminals. Since the integer values of non-terminal symbols start at n, but the grammar array is indexed starting at 0, n has to be subtracted from non-terminal symbols before they are used to perform lookups in the grammar array. As shown in FIG. 8, this happens when ExpandNonTerminal is called recursively in lines 8 and 14. The total number of characters that have been expanded is kept track of in the expanded variable and finally returned as the function's result.

In some cases, the extract function may be implemented for Re-Pair compressed dictionaries by first determining the bucket in the dictionary the requested string resides in. The implementation may then receive the header of that bucket and subsequently decode strings in the bucket until the position of the requested string is reached. Similarly, the locate function implementation may determine a candidate bucket the searched string could reside in, and then scan this bucket until the string is either found or the end of the bucket is reached. However, for both functions, decompressing the strings in the bucket takes up most of the CPU time of the whole operation. More precisely, decoding strings in the dictionary's buckets involves first expanding re-pair symbols to a sequence of non-terminals, and then decoding the full strings from their front-coded representation in the compressed sequence.

Figure 9:
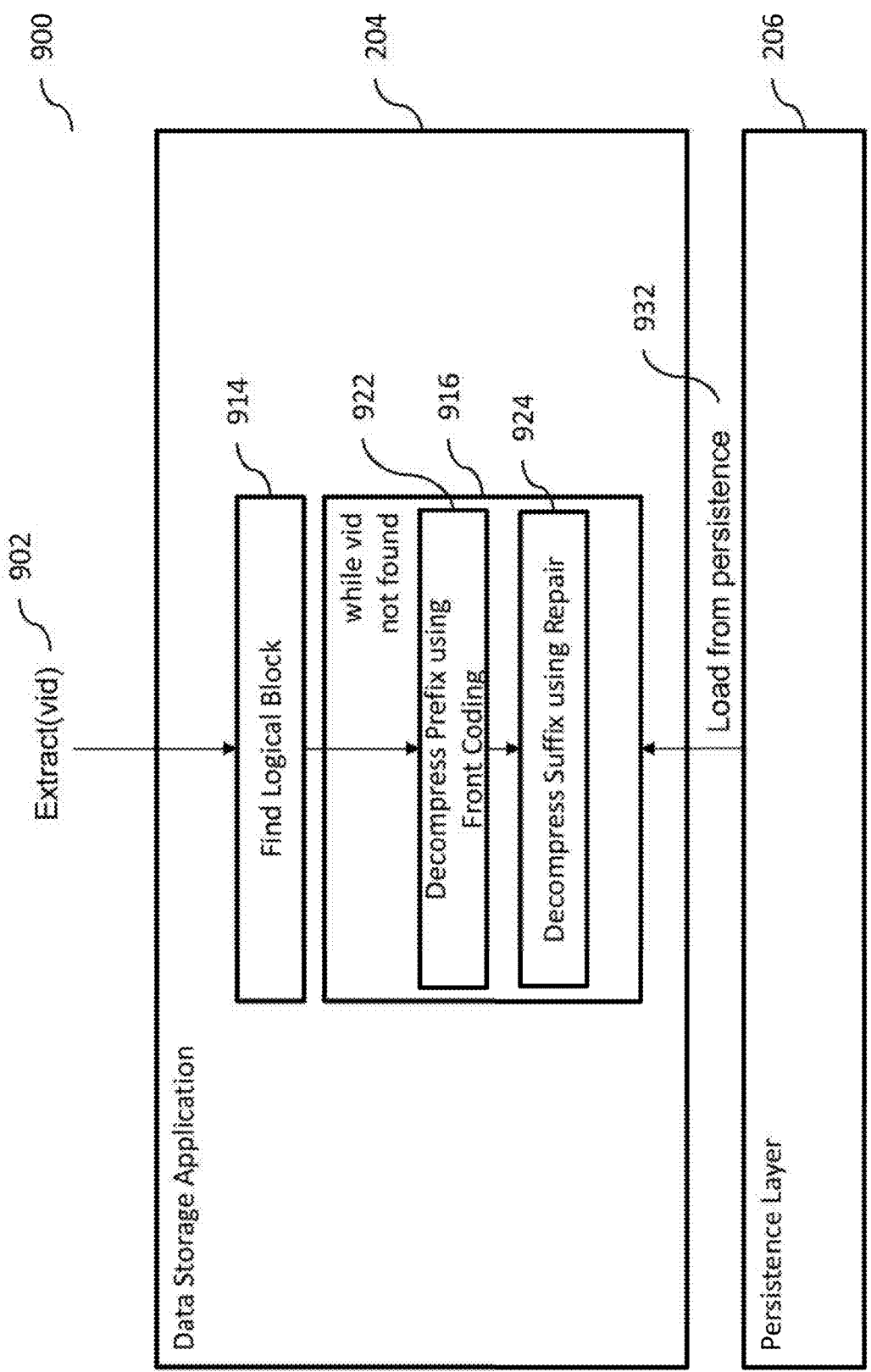
FIG. 9 illustrates an exemplary system for perform decompression and/or access of data, according to some implementations of the current subject matter.

FIG. 9 illustrates an exemplary system 900 for perform decompression and/or access of data, according to some implementations of the current subject matter. The system 900 may include similar to components to those shown in FIG. 2a. In particular, the system 900 may include the data storage application 204 communicatively coupled to the persistence layer 206. The system 900 may be configured to receive a query (a call, a request, etc.) 902 to extract a particular data (e.g., Extract(vid)). The data storage application 204 may include a logical block determination component 914 that may be configured to ascertain a particular logical block that may be corresponding to the received request 902.

The data responsive to the received request be obtained, at 932, from the persistence layer 206 for the purposes of decompression that may be performed by the component 916. The decompression may be performed by decompressing prefix using front coding, at 922, which may be followed by decompression of suffix using re-pair algorithm, at 924.

In some implementations, to perform re-pair decompression, the current subject matter may be configured to replace the ExpandNonTerminal function, described above, that is used to perform re-pair symbol expansion in the extract and locate operations with ExpandSymbol function. The ExpandSymbol function may be configured to accept a symbol instead of a non-terminal index. An exemplary ExpandSymbol function 1000 is shown in FIG. 10, where N and n may represent a number of non-terminals and terminals, respectively. The algorithm 1000 may be further configured to allow vectorization of the re-pair lookup. A necessary prerequisite of this is removing the recursive nature of the ExpandNonTerminal function.

In some implementations, ExpandSymbol may be configured to perform a depth-first traversal of the symbol tree, outputting leaves (i.e., terminals). This can be performed iteratively by processing one tree node in each iteration until symbol expansion is finished. The current node is stored in current, which is initialized to ExpandSymbol's input symbol, the root of the symbol tree. Each node encountered may either be a terminal (leaf node) or a non-terminal (inner node). If it is an inner node (Branch 1, lines 7-10 as shown in FIG. 10), the node's left and right child nodes are fetched using GetField, which may be configured to decode the symbols from the bit-packed grammar array. The right child node may be put onto a stack for later use, while the left child node may become current for the next iteration. This way the left path in the tree is always traversed until a leaf is encountered. When this happens (Branch 2, lines 12-13, as shown in FIG. 10), the leaf node (which is a terminal) may be output, and a node may be removed from the stack to be processed in the next iteration. Once the last leaf node is removed from the stack and output, the tree has been fully traversed.

In some implementations, vectorization of the re-pair lookup may be configured one or more of the following prerequisites. In particular, the component 922 of the application 204 shown in FIG. 9 may be configured to execute multiple ExpandSymbol operations in parallel using vector instructions. As stated above, ExpandSymbol may include a depth-first search on the symbols tree and since the latter can be of arbitrary depth, traversals that are executed together must have a similar number of iterations for the vectorization to be efficient. Thus, the current subject matter may be configured to limit the number of terminals a non-terminal may be configured to expand to, which may be equivalent to limiting the number of leaves in the symbol trees, thereby allowing execution of the vectorized code for a fixed number of iterations. This limitation may be enforced at compression time. In some exemplary implementations, the current subject matter may be configured to have 8 terminals that a non-terminal may expand to, which may allow execution of the vectorized code for 15 iterations. Additionally, to reduce computation in each vectorized loop iteration, the number of bits per symbol in the re-pair grammar may also be fixed (e.g., 16 bits), which may be configured to avoid decoding of a bit-packed grammar array. This may allow symbols to be loaded directly from the grammar array into CPU registers without bit-offset calculations and bit-shifting. The same may be applied to loading symbols from the compressed buckets in the compressed dictionary.

Figure 11A:
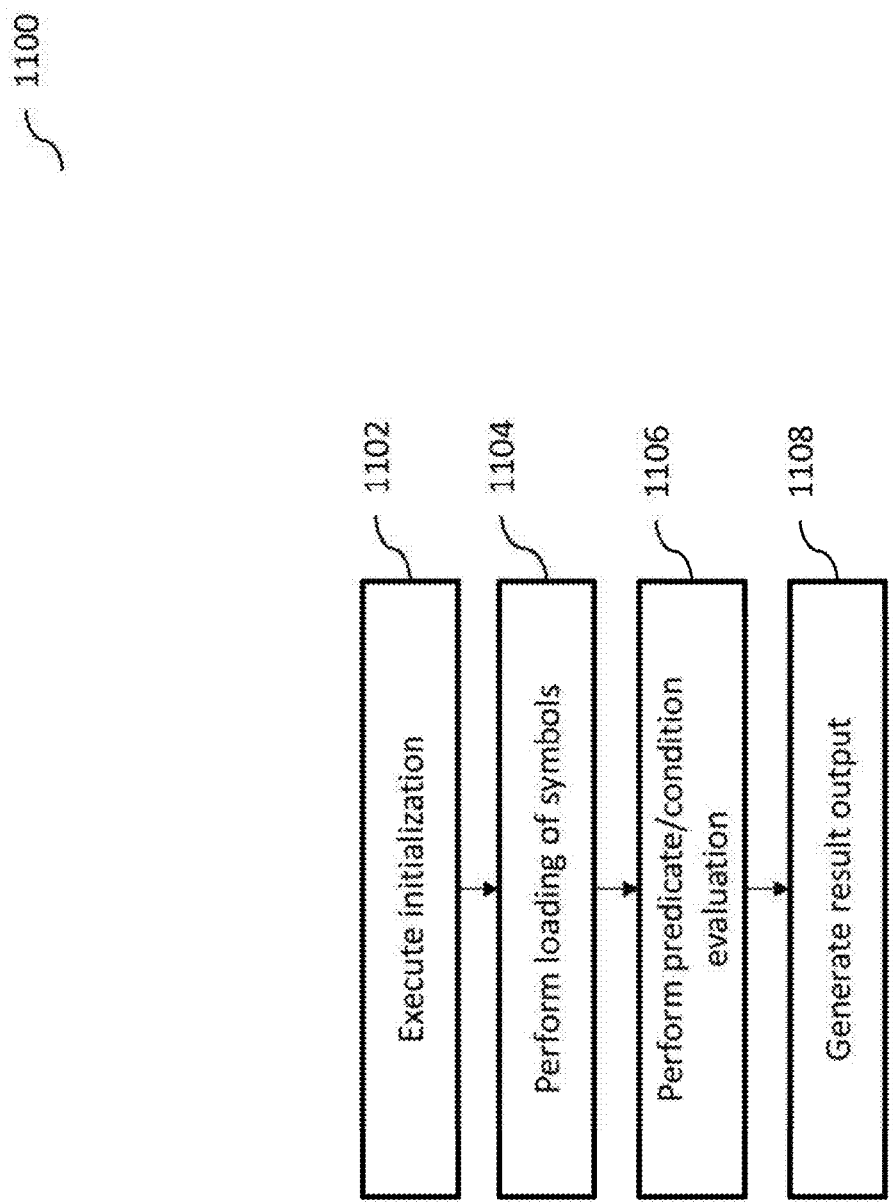
FIG. 11a illustrates an exemplary iterative version of ExpandSymbol algorithm, according to some implementations of the current subject matter.

FIG. 11a illustrates an exemplary vectorized Re-Pair expansion algorithm 1100, according to some implementations of the current subject matter. The vectorized algorithm 1100 may be performed using the following five stages: initialization 1102, branch1 and branch2 1104, condition/predicate evaluation 1106, and result output 1108. For ease of illustration and discussion, an exemplary code that may be used to execute algorithm 1100, is shown in FIG. 11b. The code is shown for the exemplary Expand16Symbols function (e.g., which may be executed by a processor capable of executing Intel Advanced Vector Extensions 512 instructions).

As shown in FIG. 11a, during initialization 1102, a stack that is 16 times the stack height of the scalar version may be zero-initialized. This is executed because each of the 16 symbols being expanded may require its own region on the stack. The stack height may be fixed to 10 per traversal. Since the expansion of symbols is limited to 8 characters for this exemplary function (i.e., Expand16Symbols), the stack height may be 8, but two additional elements may be added at the bottom of the stack to permit reading from and writing to the stack without bounds checking for symbols that may have finished expanding. The stack position may be initialized to two for all elements. This way, a stack position of 1 may signal that a symbol has been fully expanded. Once this has happened the stack position for this symbol is not changed in subsequent iterations.

Subsequent to the initialization, the exemplary vectorized Re-Pair expansion process 1100 may be configured to execute branches 1 and 2 1104*a*, 1104*b*, respectively, for the purposes of loading of symbols. In particular, Branch 1 1104*a* may be responsible for loading child symbols of the current symbols from the grammar array and storing the correct symbols in the stack. Branch 2 1104*b* may be responsible for loading new current symbols from the stack. The loading may be executed for all symbols (e.g., 16 symbols) simultaneously.

Once loading is completed, the exemplary vectorized Re-Pair expansion algorithm 1100 may be configured to perform predicate/condition evaluation, at 1106. At 1106, results of the symbol loading, as performed at 1104, may be combined based on the evaluation of predicates.

Upon completion of predicate evaluation, the vectorization algorithm 1100 may be configured to output a result, at 1108. In particular, the resulting individual expanded strings may be processed to form a single contiguous string corresponding to the expansion of all 16 symbols.

In some implementations, the vectorization process 1100 may be configured to improve access times to compressed data. In particular, the extract and locate operations, discussed above, implementing the process 1100 may be executed 2-2.7 faster than systems using existing decompression processes.

In some implementations, the current subject matter, including the compression and decompression/access processes discussed above, can be implemented in various in-memory database systems, such as a High Performance Analytic Appliance ("HANA") system as developed by SAP SE, Walldorf, Germany. Various systems, such as, enterprise resource planning ("ERP") system, supply chain management system ("SCM") system, supplier relationship management ("SRM") system, customer relationship management ("CRM") system, and/or others, can interact with the in-memory system for the purposes of accessing data, for example. Other systems and/or combinations of systems can be used for implementations of the current subject matter. The following is a discussion of an exemplary in-memory system.

Figure 12:
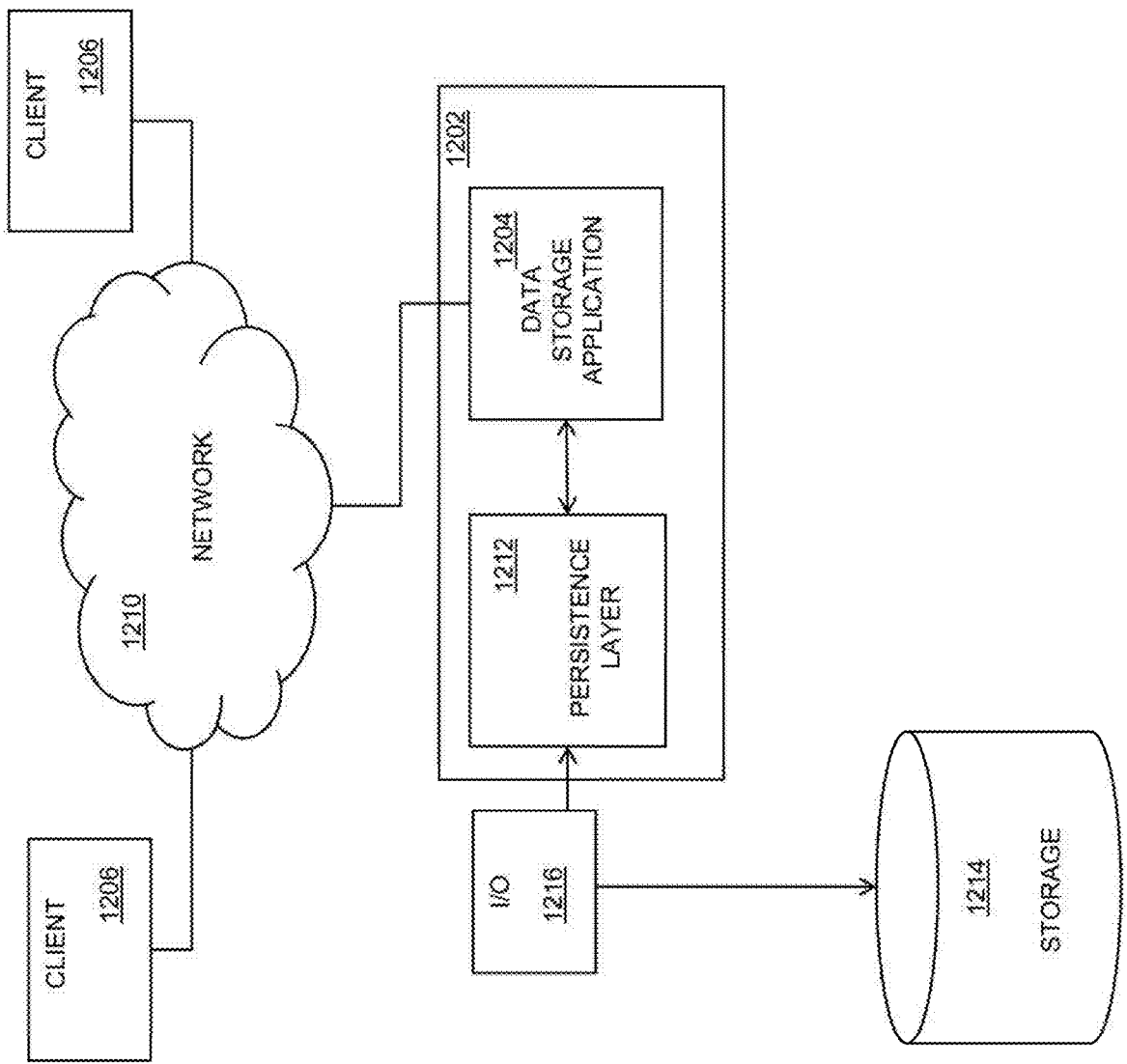
FIG. 12 is a diagram illustrating an exemplary system including a data storage application, according to some implementations of the current subject matter.

FIG. 12 illustrates an exemplary system 1200 in which a computing system 1202, which can include one or more programmable processors that can be collocated, linked over one or more networks, etc., executes one or more modules, software components, or the like of a data storage application 1204, according to some implementations of the current subject matter. The data storage application 1204 can include one or more of a database, an enterprise resource program, a distributed storage system (e.g. NetApp Filer available from NetApp of Sunnyvale, CA), or the like.

The one or more modules, software components, or the like can be accessible to local users of the computing system 1202 as well as to remote users accessing the computing system 1202 from one or more client machines 1206 over a network connection 1210. One or more user interface screens produced by the one or more first modules can be displayed to a user, either via a local display or via a display associated with one of the client machines 1206. Data units of the data storage application 1204 can be transiently stored in a persistence layer 1212 (e.g., a page buffer or other type of temporary persistency layer), which can write the data, in the form of storage pages, to one or more storages 1214, for example via an input/output component 1216. The one or more storages 1214 can include one or more physical storage media or devices (e.g. hard disk drives, persistent flash memory, random access memory, optical media, magnetic media, and the like) configured for writing data for longer term storage. It should be noted that the storage 1214 and the input/output component 1216 can be included in the computing system 1202 despite their being shown as external to the computing system 1202 in FIG. 12.

Data retained at the longer term storage 1214 can be organized in pages, each of which has allocated to it a defined amount of storage space. In some implementations, the amount of storage space allocated to each page can be constant and fixed. However, other implementations in which the amount of storage space allocated to each page can vary are also within the scope of the current subject matter.

Figure 13:
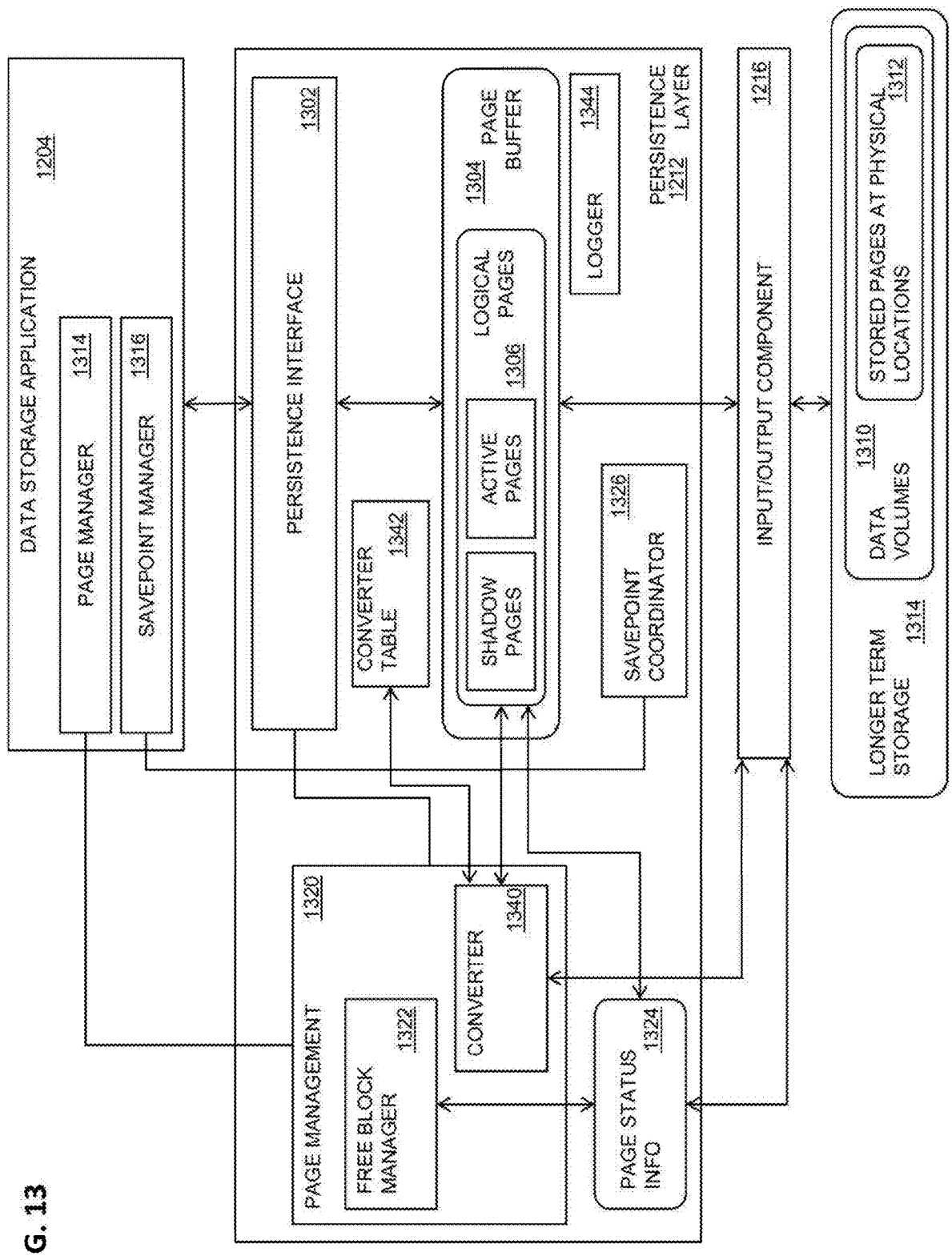
FIG. 13 is a diagram illustrating details of the system of FIG. 12.

FIG. 13 illustrates exemplary software architecture 1300, according to some implementations of the current subject matter. A data storage application 1204, which can be implemented in one or more of hardware and software, can include one or more of a database application, a network-attached storage system, or the like. According to at least some implementations of the current subject matter, such a data storage application 1204 can include or otherwise interface with a persistence layer 1212 or other type of memory buffer, for example via a persistence interface 1302. A page buffer 1304 within the persistence layer 1212 can store one or more logical pages 1306, and optionally can include shadow pages, active pages, and the like. The logical pages 1306 retained in the persistence layer 1212 can be written to a storage (e.g. a longer term storage, etc.) 1214 via an input/output component 1216, which can be a software module, a sub-system implemented in one or more of software and hardware, or the like. The storage 1214 can include one or more data volumes 1310 where stored pages 1312 are allocated at physical memory blocks.

In some implementations, the data storage application 1204 can include or be otherwise in communication with a page manager 1314 and/or a savepoint manager 1316. The page manager 1314 can communicate with a page management module 1320 at the persistence layer 1212 that can include a free block manager 1322 that monitors page status information 1324, for example the status of physical pages within the storage 1214 and logical pages in the persistence layer 1212 (and optionally in the page buffer 1304). The savepoint manager 1316 can communicate with a savepoint coordinator 1326 at the persistence layer 1212 to handle savepoints, which are used to create a consistent persistent state of the database for restart after a possible crash.

In some implementations of a data storage application 1204, the page management module of the persistence layer 1212 can implement a shadow paging. The free block manager 1322 within the page management module 1320 can maintain the status of physical pages. The page buffer 1304 can include a fixed page status buffer that operates as discussed herein. A converter component 1340, which can be part of or in communication with the page management module 1320, can be responsible for mapping between logical and physical pages written to the storage 1214. The converter 1340 can maintain the current mapping of logical pages to the corresponding physical pages in a converter table 1342. The converter 1340 can maintain a current mapping of logical pages 1306 to the corresponding physical pages in one or more converter tables 1342. When a logical page 1306 is read from storage 1214, the storage page to be loaded can be looked up from the one or more converter tables 1342 using the converter 1340. When a logical page is written to storage 1214 the first time after a savepoint, a new free physical page is assigned to the logical page. The free block manager 1322 marks the new physical page as "used" and the new mapping is stored in the one or more converter tables 1342.

The persistence layer 1212 can ensure that changes made in the data storage application 1204 are durable and that the data storage application 1204 can be restored to a most recent committed state after a restart. Writing data to the storage 1214 need not be synchronized with the end of the writing transaction. As such, uncommitted changes can be written to disk and committed changes may not yet be written to disk when a writing transaction is finished. After a system crash, changes made by transactions that were not finished can be rolled back. Changes occurring by already committed transactions should not be lost in this process. A logger component 1344 can also be included to store the changes made to the data of the data storage application in a linear log. The logger component 1344 can be used during recovery to replay operations since a last savepoint to ensure that all operations are applied to the data and that transactions with a logged "commit" record are committed before rolling back still-open transactions at the end of a recovery process.

With some data storage applications, writing data to a disk is not necessarily synchronized with the end of the writing transaction. Situations can occur in which uncommitted changes are written to disk and while, at the same time, committed changes are not yet written to disk when the writing transaction is finished. After a system crash, changes made by transactions that were not finished must be rolled back and changes by committed transaction must not be lost.

To ensure that committed changes are not lost, redo log information can be written by the logger component 1344 whenever a change is made. This information can be written to disk at latest when the transaction ends. The log entries can be persisted in separate log volumes while normal data is written to data volumes. With a redo log, committed changes can be restored even if the corresponding data pages were not written to disk. For undoing uncommitted changes, the persistence layer 1212 can use a combination of undo log entries (from one or more logs) and shadow paging.

The persistence interface 1302 can handle read and write requests of stores (e.g., in-memory stores, etc.). The persistence interface 1302 can also provide write methods for writing data both with logging and without logging. If the logged write operations are used, the persistence interface 1302 invokes the logger 1344. In addition, the logger 1344 provides an interface that allows stores (e.g., in-memory stores, etc.) to directly add log entries into a log queue. The logger interface also provides methods to request that log entries in the in-memory log queue are flushed to disk.

Log entries contain a log sequence number, the type of the log entry and the identifier of the transaction. Depending on the operation type additional information is logged by the logger 1344. For an entry of type "update", for example, this would be the identification of the affected record and the after image of the modified data.

When the data application 1204 is restarted, the log entries need to be processed. To speed up this process the redo log is not always processed from the beginning. Instead, as stated above, savepoints can be periodically performed that write all changes to disk that were made (e.g., in memory, etc.) since the last savepoint. When starting up the system, only the logs created after the last savepoint need to be processed. After the next backup operation the old log entries before the savepoint position can be removed.

When the logger 1344 is invoked for writing log entries, it does not immediately write to disk. Instead it can put the log entries into a log queue in memory. The entries in the log queue can be written to disk at the latest when the corresponding transaction is finished (committed or aborted). To guarantee that the committed changes are not lost, the commit operation is not successfully finished before the corresponding log entries are flushed to disk. Writing log queue entries to disk can also be triggered by other events, for example when log queue pages are full or when a savepoint is performed.

With the current subject matter, the logger 1344 can write a database log (or simply referred to herein as a "log") sequentially into a memory buffer in natural order (e.g., sequential order, etc.). If several physical hard disks/storage devices are used to store log data, several log partitions can be defined. Thereafter, the logger 1344 (which as stated above acts to generate and organize log data) can load-balance writing to log buffers over all available log partitions. In some cases, the load-balancing is according to a round-robin distributions scheme in which various writing operations are directed to log buffers in a sequential and continuous manner. With this arrangement, log buffers written to a single log segment of a particular partition of a multi-partition log are not consecutive. However, the log buffers can be reordered from log segments of all partitions during recovery to the proper order.

As stated above, the data storage application 1204 can use shadow paging so that the savepoint manager 1316 can write a transactionally-consistent savepoint. With such an arrangement, a data backup comprises a copy of all data pages contained in a particular savepoint, which was done as the first step of the data backup process. The current subject matter can be also applied to other types of data page storage.

Figure 14:
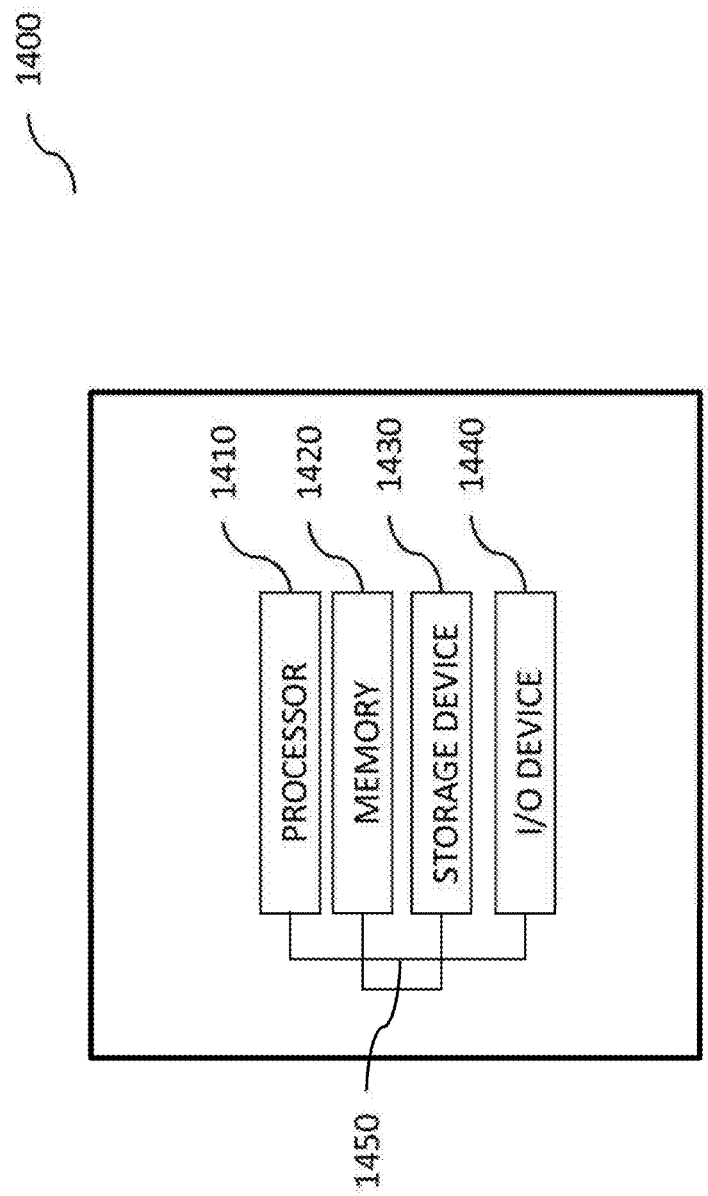
FIG. 14 is an exemplary system, according to some implementations of the current subject matter.

In some implementations, the current subject matter can be configured to be implemented in a system 1400, as shown in FIG. 14. The system 1400 can include a processor 1410, a memory 1420, a storage device 1430, and an input/output device 1440. Each of the components 1410, 1420, 1430 and 1440 can be interconnected using a system bus 1450. The processor 1410 can be configured to process instructions for execution within the system 1400. In some implementations, the processor 1410 can be a single-threaded processor. In alternate implementations, the processor 1410 can be a multi-threaded processor. The processor 1410 can be further configured to process instructions stored in the memory 1420 or on the storage device 1430, including receiving or sending information through the input/output device 1440. The memory 1420 can store information within the system 1400. In some implementations, the memory 1420 can be a computer-readable medium. In alternate implementations, the memory 1420 can be a volatile memory unit. In yet some implementations, the memory 1420 can be a non-volatile memory unit. The storage device 1430 can be capable of providing mass storage for the system 1400. In some implementations, the storage device 1430 can be a computer-readable medium. In alternate implementations, the storage device 1430 can be a floppy disk device, a hard disk device, an optical disk device, a tape device, non-volatile solid state memory, or any other type of storage device. The input/output device 1440 can be configured to provide input/output operations for the system 1400. In some implementations, the input/output device 1440 can include a keyboard and/or pointing device. In alternate implementations, the input/output device 1440 can include a display unit for displaying graphical user interfaces.

Figure 15:
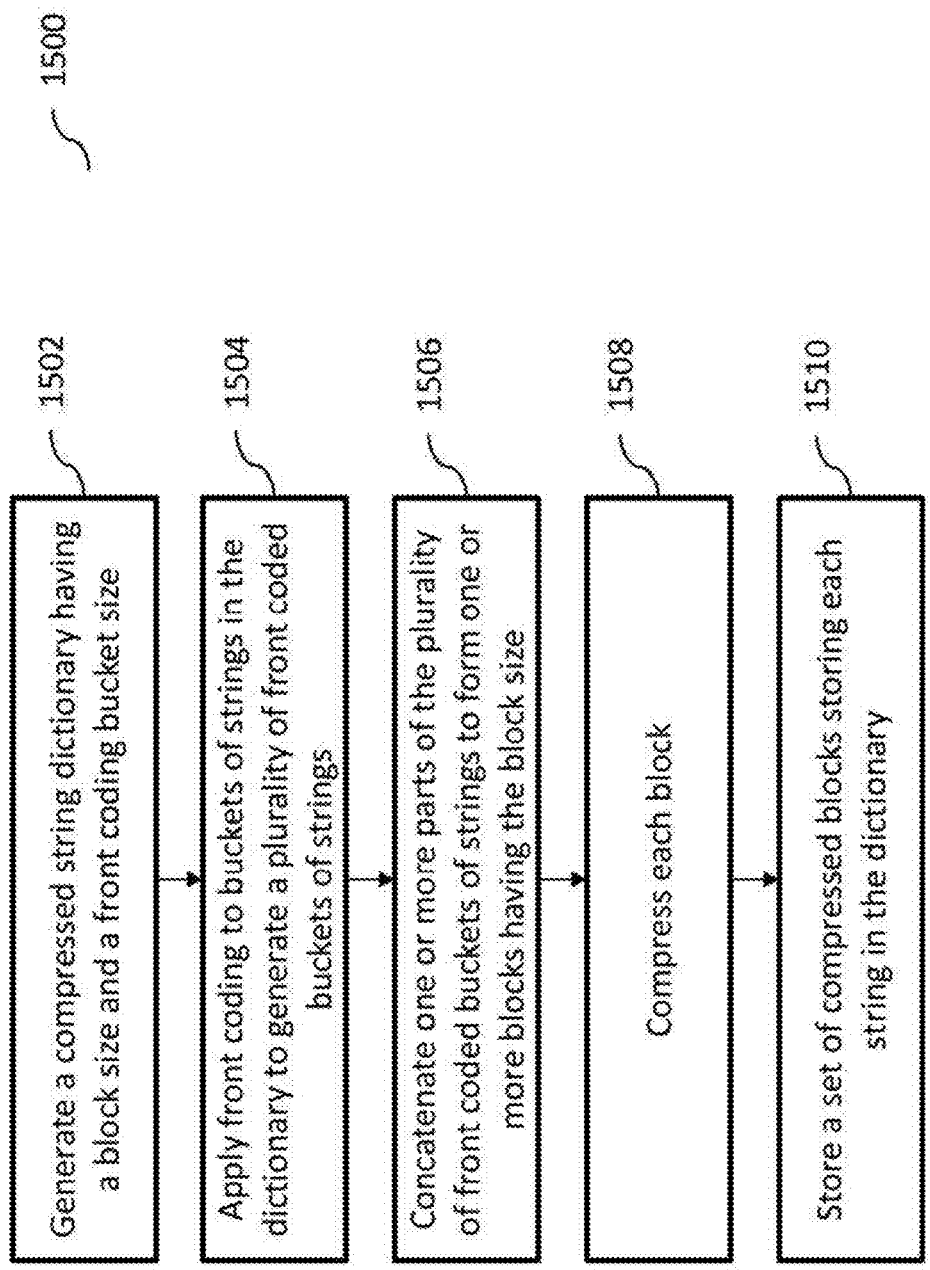
FIG. 15 is an exemplary method, according to some implementations of the current subject matter.

FIG. 15 illustrates an exemplary process 1500 for performing compression of data, according to some implementations of the current subject matter. The process 1500 may be executed by the system 200 shown in FIG. 2*a*, and in particular using the data storage application 204. At 1502, a request to compress data (e.g., dictionary string) may be received by the data storage application 204 (e.g., request 202 shown in FIG. 2*a*) and a compressed string dictionary having a block size and a front coding bucket size may be generated. At 1504, a front coding may be applied to one or more buckets of strings in the dictionary having the front coding bucket size to generate a plurality of front coded buckets of strings (as for example, is shown in FIG. 2*a*, at 216). At 1506, one or more portions of the plurality of front coded buckets of strings may be concatenated to form one or more blocks having the block size. Then, one or more blocks may be compressed, at 1508. At 1510, a set of compressed blocks corresponding to each string in the dictionary may be stored in the persistence layer 206, as shown in FIG. 2*a*, where the set of the compressed blocks can_store all strings in the dataset.

In some implementations, the current subject matter may include one or more of the following optional features. In some implementations, each block in the set of compressed blocks may include a sequence of bucket headers and compressed buckets.

In some implementations, the method may also include inserting a termination character between buckets of strings in the plurality of front coded buckets of strings. The termination character might not be compressed.

In some implementations, each string may include a string termination character, wherein each string termination character is compressed.

In some alternate implementations, the length of each string can be stored and compressed with the string.

In some implementations, the block size may be at least one of the following: a fixed size and a variable size.

In some implementations, the compression may include independently executing compression of each front coded bucket in the plurality of buckets in parallel.

In some implementations, one or more front-coded buckets may be configured to be sampled to form one or more superblocks. Each superblock may be configured to be subsequently compressed to generate a shared grammar for compression of the blocks. For example, the shared grammar may be used to perform accelerated compression of the blocks.

In some implementations, the compression of blocks may include Re-Pair compression.

In some implementations, the method 1100 may further include receiving a request to access data in the set of stored compressed blocks, identifying one or more compressed blocks in the set of stored compressed blocks responsive to the received request, and at least partially decompressing the identified compressed blocks to generate uncompressed data. The decompression may include decompressing string prefixes and suffixes inside the identified compressed blocks using front coding, and decompressing string suffixes inside the identified compressed blocks using a re-pair decompression. Further, the re-pair decompression may include iteratively expanding each symbol in a symbol tree corresponding to the data stored in the identified compressed blocks.

Figure 16:
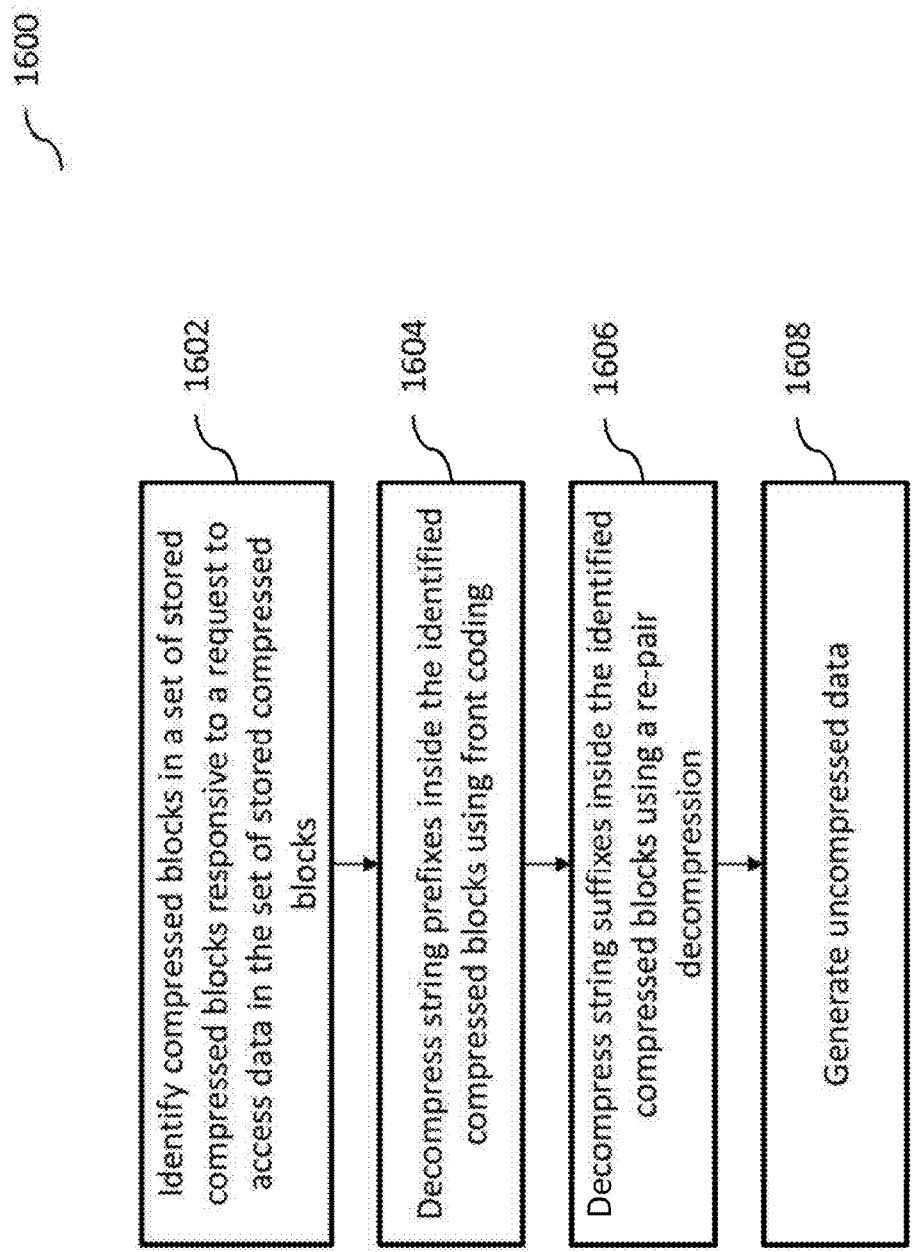
FIG. 16 is an exemplary method, according to some implementations of the current subject matter.

FIG. 16 illustrates an exemplary process 1600 for performing decompression of data, according to some implementations of the current subject matter. The process 1600 may be executed by the system 200 shown in FIG. 2*a*, and in particular using the data storage application 204. At 1602, one or more compressed blocks in a set of stored compressed blocks responsive to a request to access data in the set of stored compressed blocks may be identified. At 1604, string prefixes inside the identified compressed blocks may be decompressed using front coding. At 1606, string suffixes inside the identified compressed blocks may be decompressed using a re-pair decompression. At 1608, uncompressed data may be generated.

In some implementations, the current subject matter may include one or more of the following optional features. In some implementations, the re-pair decompression may include iteratively expanding each symbol in a symbol tree corresponding to the data stored in the identified compressed blocks. The symbol tree may include a plurality of nodes. The compressed blocks may be generated from one or more front coded buckets of strings in a dictionary. The front-coded buckets may be configured to be sampled to form one or more superblocks. Each of the superblocks may be configured to be compressed to generate a shared grammar for compression of the compressed blocks. The plurality of nodes may include at least one of the following: a terminal character, a non-terminal character, and any combination thereof. In some implementations, the method may further include performing a plurality of re-pair decompressions in parallel. The number of terminal characters may be limited to a predetermined number. Further, the number of iterative expansions of each symbols may be determined based on the predetermined number.

In some implementations, the re-pair decompression may include: initializing a stack position in a memory corresponding to each symbol in the symbol tree, simultaneously loading, using a vectorized re-pair expansion, each symbol in the symbol tree from storage into the memory, combining loaded symbols into the uncompressed data by evaluating one or more predicates associated with the symbols, and repeating, using the predetermined number, the simultaneous loading and the combining.

In some implementations, each block in the set of compressed blocks may include a sequence of bucket headers and compressed buckets. The block size may be at least one of the following: a fixed size and a variable size. Further, the compressed blocks may be compressed using re-pair compression.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

The systems and methods disclosed herein can be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

As used herein, the term "user" can refer to any entity including a person or a computer.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A computer-implemented method, comprising:
   decompressing string prefixes inside identified compressed blocks using front coding;
   decompressing string suffixes inside the identified compressed blocks using a re-pair decompression; and
   generating uncompressed data.

2. The computer-implemented method according to claim 1, wherein the identified compressed blocks are identified from a set of one or more compressed blocks, wherein the one or more compressed blocks are generated from one or more front coded buckets of strings in a dictionary, the one or more front coded buckets are configured to be sampled to form one or more superblocks, wherein each one or more superblocks are configured to be compressed to generate a shared grammar for compression of the one or more compressed blocks.

3. The computer-implemented method according to claim 2, wherein each block in the set of the one or more compressed blocks includes a sequence of bucket headers and compressed buckets.

4. The computer-implemented method according to claim 1, wherein the re-pair decompression includes iteratively expanding each symbol in a symbol tree corresponding to data stored in the identified compressed blocks.

5. The computer-implemented method according to claim 4, wherein the symbol tree includes a plurality of nodes, wherein the plurality of nodes includes at least one a terminal character and/or at least one of a non-terminal character, and any combination thereof.

6. The computer-implemented method according to claim 1, further comprising performing a plurality of re-pair decompressions in parallel.

7. The computer-implemented method according to claim 1, wherein the re-pair decompression comprises initializing a stack position in a memory corresponding to each symbol in a symbol tree.

8. The computer-implemented method according to claim 7, wherein the re-pair decompression comprises simultaneously loading, using vector instructions, each symbol in the symbol tree from storage into the memory.

9. The computer-implemented method according to claim 8, wherein the re-pair decompression comprises combining loaded symbols into the uncompressed data by evaluating one or more predicates associated with the loaded symbols.

10. The computer-implemented method according to claim 9, wherein the re-pair decompression comprises repeating, using a predetermined number, the simultaneously loading and the combining.

11. A system comprising:
at least one programmable processor; and
a non-transitory machine-readable medium storing instructions that, when executed by the at least one programmable processor, cause the at least one programmable processor to perform operations comprising:
decompressing string prefixes inside identified compressed blocks using front coding;
decompressing string suffixes inside the identified compressed blocks using a re-pair decompression; and
generating uncompressed data.

12. The system according to claim 11, wherein the identified compressed blocks are identified from a set of one or more compressed blocks, wherein the one or more compressed blocks are generated from one or more front coded buckets of strings in a dictionary, the one or more front coded buckets are configured to be sampled to form one or more superblocks, wherein each one or more superblocks are configured to be compressed to generate a shared grammar for compression of the one or more compressed blocks.

13. The system according to claim 12, wherein each block in the set of the one or more compressed blocks includes a sequence of bucket headers and compressed buckets.

14. The system according to claim 11, wherein the re-pair decompression includes iteratively expanding each symbol in a symbol tree corresponding to data stored in the identified compressed blocks.

15. The system according to claim 14, wherein the symbol tree includes a plurality of nodes, wherein the plurality of nodes includes at least one of the following: a terminal character, a non-terminal character, and any combination thereof.

16. The system according to claim 11, further comprising performing a plurality of re-pair decompressions in parallel.

17. The system according to claim 11, wherein the re-pair decompression comprises initializing a stack position in a memory corresponding to each symbol in a symbol tree.

18. A computer program product comprising a non-transitory machine-readable medium storing instructions that, when executed by at least one programmable processor, cause the at least one programmable processor to perform operations comprising:
decompressing string prefixes inside identified compressed blocks using front coding, the identified compressed blocks identified from a set of stored one or more compressed blocks;
decompressing string suffixes inside the identified compressed blocks using a re-pair decompression; and
generating uncompressed data.

* * * * *